(12) United States Patent
Mizutani et al.

(10) Patent No.: US 11,217,803 B2
(45) Date of Patent: Jan. 4, 2022

(54) FUEL CELL SYSTEM AND METHOD FOR INFERRING WET STATE OF FUEL CELL

(71) Applicant: TOYOTA JIDOSHA KABUSHIKI KAISHA, Toyota (JP)

(72) Inventors: Chiaki Mizutani, Nisshin (JP); Shigeki Hasegawa, Toyota (JP); Kazuo Yamamoto, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 49 days.

(21) Appl. No.: 16/456,134

(22) Filed: Jun. 28, 2019

(65) Prior Publication Data

US 2020/0006792 A1    Jan. 2, 2020

(30) Foreign Application Priority Data

Jul. 2, 2018 (JP) .............................. JP2018-125800

(51) Int. Cl.
| | |
|---|---|
| *H01M 8/04537* | (2016.01) |
| *H01M 8/2457* | (2016.01) |
| *H01M 8/2484* | (2016.01) |
| *H01M 8/0267* | (2016.01) |
| *H01M 8/04119* | (2016.01) |
| *H01M 8/04291* | (2016.01) |
| *H01M 8/241* | (2016.01) |
| *G01R 31/389* | (2019.01) |

(52) U.S. Cl.
CPC ...... *H01M 8/04649* (2013.01); *G01R 31/389* (2019.01); *H01M 8/0267* (2013.01); *H01M 8/04179* (2013.01); *H01M 8/04291* (2013.01); *H01M 8/241* (2013.01); *H01M 8/2457* (2016.02); *H01M 8/2484* (2016.02)

(58) Field of Classification Search
CPC .................................................. H01M 8/04649
See application file for complete search history.

(56) References Cited

U.S. PATENT DOCUMENTS

| | | | |
|---|---|---|---|
| 2009/0226770 A1* | 9/2009 | Manabe ............ | H01M 8/04567 429/431 |
| 2017/0045588 A1* | 2/2017 | Aoki ..................... | G01R 31/389 |
| 2017/0324104 A1* | 11/2017 | Aoki ...................... | H01M 8/10 |
| 2018/0048006 A1* | 2/2018 | Kotaka ............. | H01M 8/04529 |

FOREIGN PATENT DOCUMENTS

JP         2014207049 A    10/2014

* cited by examiner

*Primary Examiner* — Brian R Ohara
(74) *Attorney, Agent, or Firm* — Dickinson Wright, PLLC

(57) ABSTRACT

Provided is a fuel cell system including: a fuel cell; a reactant gas supply section; a converter; an alternating-current superimposing unit; a phase difference deriving unit configured to derive a phase difference that is a phase lag of an alternating-current voltage relative to an alternating current in an alternating-current component output from the fuel cell; and a first inference unit. The first inference unit infers that the fuel cell is in an inappropriate wet state, when the absolute value of an amount of change in the phase difference has become equal to or larger than a predetermined criterion value immediately after the magnitude of a change in the value of at least one of parameters that are a flow rate of a reactant gas, a stoichiometric ratio, and an output current has exceeded a predetermined criterion.

8 Claims, 10 Drawing Sheets

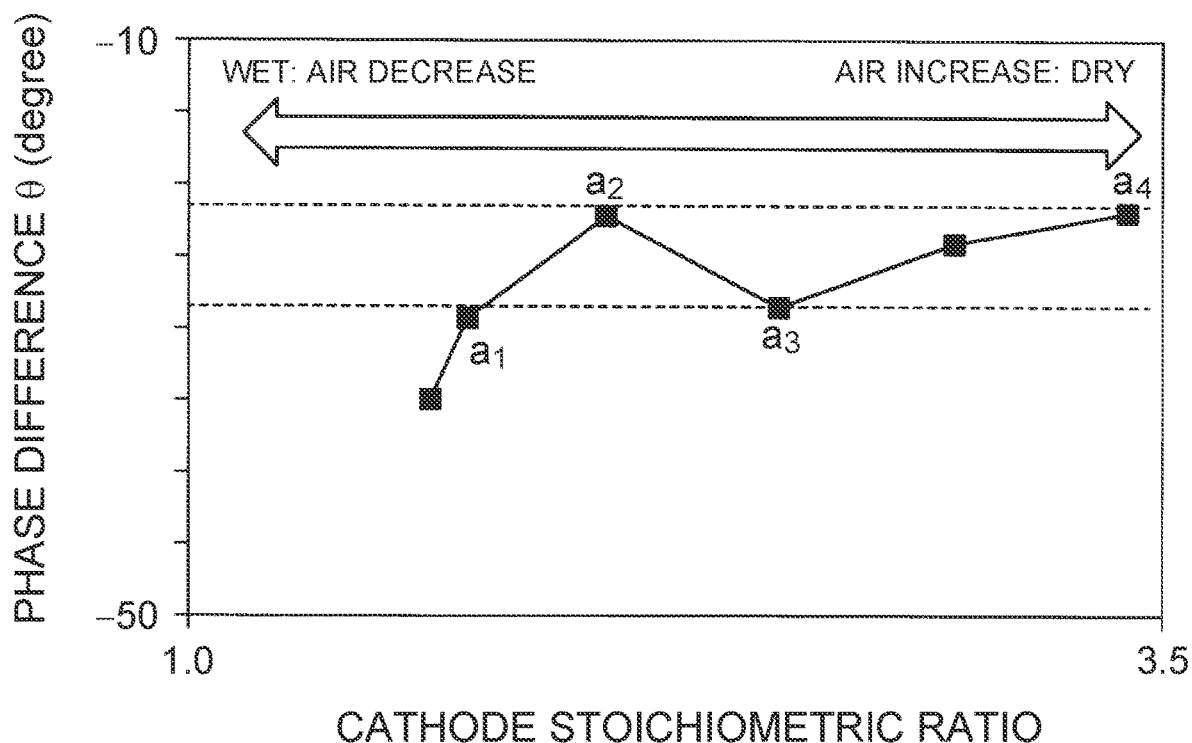

FIG. 6

| | OPERATION STATE 1 | OPERATION STATE 2 | OPERATION STATE 3 |
|---|---|---|---|
| GAS FLOW RATE (AMOUNT OF MOISTURE CARRIED AWAY) | VARYING | VARYING | CONSTANT |
| STOICHIOMETRIC RATIO | CONSTANT | VARYING | VARYING |
| OUTPUT CURRENT (AMOUNT OF WATER GENERATED) | VARYING | CONSTANT | VARYING |
| RAPID INCREASE IN GAS FLOW RATE | EXCESSIVELY DRY OR EXCESSIVELY WET (BOTH AMOUNT OF WATER GENERATED AND AMOUNT OF MOISTURE CARRIED AWAY INCREASE) | EXCESSIVELY DRY (AMOUNT OF MOISTURE CARRIED AWAY INCREASES RELATIVE TO AMOUNT OF WATER GENERATED) | — |
| RAPID DECREASE IN GAS FLOW RATE | EXCESSIVELY DRY OR EXCESSIVELY WET (BOTH AMOUNT OF WATER GENERATED AND AMOUNT OF MOISTURE CARRIED AWAY DECREASE) | EXCESSIVELY WET (AMOUNT OF MOISTURE CARRIED AWAY DECREASES RELATIVE TO AMOUNT OF WATER GENERATED) | — |
| RAPID INCREASE IN OUTPUT CURRENT | EXCESSIVELY DRY OR EXCESSIVELY WET (BOTH AMOUNT OF WATER GENERATED AND AMOUNT OF MOISTURE CARRIED AWAY INCREASE) | — | EXCESSIVELY WET (AMOUNT OF WATER GENERATED INCREASES WHILE AMOUNT OF MOISTURE CARRIED AWAY REMAINS CONSTANT) |
| RAPID DECREASE IN OUTPUT CURRENT | EXCESSIVELY DRY OR EXCESSIVELY WET (BOTH AMOUNT OF WATER GENERATED AND AMOUNT OF MOISTURE CARRIED AWAY DECREASE) | — | EXCESSIVELY DRY (AMOUNT OF WATER GENERATED DECREASES WHILE AMOUNT OF MOISTURE CARRIED AWAY REMAINS CONSTANT) |
| RAPID INCREASE IN STOICHIOMETRIC RATIO | — | EXCESSIVELY DRY (SAME AS WITH RAPID INCREASE IN GAS FLOW RATE) | EXCESSIVELY DRY (SAME AS WITH RAPID DECREASE IN OUTPUT CURRENT) |
| RAPID DECREASE IN STOICHIOMETRIC RATIO | — | EXCESSIVELY WET (SAME AS WITH RAPID DECREASE IN GAS FLOW RATE) | EXCESSIVELY WET (SAME AS WITH RAPID INCREASE IN OUTPUT CURRENT) |

FUEL CELL SYSTEM AND METHOD FOR INFERRING WET STATE OF FUEL CELL

INCORPORATION BY REFERENCE

The disclosure of Japanese Patent Application No. 2018-125800 filed on Jul. 2, 2018 including the specification, drawings and abstract is incorporated herein by reference in its entirety.

BACKGROUND

1. Technical Field

The present disclosure relates to a fuel cell system and a method for inferring a wet state of a fuel cell.

2. Description of Related Art

To allow a fuel cell to appropriately generate electricity, it is desirable to have an accurate knowledge of the amount of moisture inside the fuel cell. Examples of known techniques for determining a wet state inside a fuel cell include one in which an alternating-current signal is applied to a fuel cell and the wet state is determined based on a phase angle of a resulting output (e.g., see Japanese Patent Application Publication No. 2014-207049).

SUMMARY

The inventor of the present application has confirmed that a certain correlation can exist between a wet state and a phase difference, specifically a phase shift of an alternating-current voltage relative to an alternating current, in an alternating-current component extracted from an output of a fuel cell obtained by applying an alternating-current signal to the fuel cell. What the inventor of the present application has discovered as new knowledge is that this correlation between the phase difference and the wet state may be disrupted when wetness has progressed excessively or dryness has progressed excessively, and that in such a case the wet state can no longer be determined based on the phase difference. It is therefore desirable to accurately determine an inappropriate wet state, specifically an excessively wet state or an excessively dry state, that disrupts the correlation between the phase difference and the wet state.

The present disclosure can be realized in the following forms of implementation.

A fuel cell system is provided as one form of implementation of the present disclosure. This fuel cell system includes: a fuel cell; a reactant gas supply section that supplies the fuel cell with a fuel gas and an oxidation gas that are reactant gases; a converter that takes out a current and a voltage from the fuel cell toward a load and controls the current and the voltage; an alternating-current superimposing unit that superimposes an alternating-current signal on one of the current and the voltage taken out from the fuel cell by the converter; a phase difference deriving unit that extracts an alternating-current component from an output of the fuel cell and derives a phase difference that is a phase lag of an alternating-current voltage relative to an alternating current in the alternating-current component; and a first inference unit that infers that a wet state of the fuel cell is an inappropriate wet state corresponding to an excessively wet state or an excessively dry state, when, immediately after the magnitude of a change in the value of at least one of parameters that are a flow rate of the reactant gas supplied to the fuel cell, a stoichiometric ratio of the reactant gas, and an output current of the fuel cell, during a predetermined first measurement period is determined to have exceeded a predetermined criterion, the absolute value of an amount of change in the phase difference during a predetermined second measurement period has become equal to or larger than a predetermined criterion value for the phase difference.

The fuel cell system of this form of implementation can infer that the fuel cell has shifted into an inappropriate wet state by using the amount of change in the phase difference, even when the correlation between the phase difference and the wet state of the fuel cell is disrupted as the wet state of the fuel cell becomes inappropriate.

In the fuel cell system of the above form of implementation, the first inference unit may determine that the magnitude of the change in the value of the parameter has exceeded the predetermined criterion, when an amount of change in the value of the parameter during the first measurement period has exceeded a predetermined criterion value for the parameter.

The fuel cell system of this form of implementation can determine whether or not the magnitude of the change in the value of the parameter exceeds the predetermined criterion by comparing the amount of change in the value of the parameter and the criterion value for the parameter.

In the fuel cell system of the above form of implementation, the first inference unit may determine that the magnitude of the change in the value of the parameter has exceeded the predetermined criterion, when the ratio of an amount of change in the value of the parameter during the first measurement period to a value of the parameter at the start of the first measurement period has exceeded a predetermined criterion value for the parameter.

The fuel cell system of this form of implementation can determine whether or not the magnitude of the change in the value of the parameter exceeds the predetermined criterion by comparing the criterion value for the parameter and the ratio of the amount of change in the value of the parameter to the value of the parameter at the start of the first measurement period.

In the fuel cell system of the above form of implementation, when the first inference unit infers that the wet state is the inappropriate wet state, the first inference unit may infer that the wet state is the excessively wet state when the amount of change in the phase difference has a negative value, and may infer that the wet state is the excessively dry state when the amount of change in the phase difference has a positive value.

The fuel cell system of this form of implementation can distinguish between the excessively wet state and the excessively dry state based on whether the value of the amount of change in the phase difference is positive or negative.

The fuel cell system of the above form of implementation may further include a gas control unit that controls the reactant gas supply section. The gas control unit may, by using the reactant gas supply section, increase an amount of at least one of the fuel gas and the oxidation gas supplied to the fuel cell, when the first inference unit has inferred that the wet state is the excessively wet state, and decrease an amount of at least one of the fuel gas and the oxidation gas supplied to the fuel cell, when the first inference unit has inferred that the wet state is the excessively dry state.

When the fuel cell is in the excessively wet state, the fuel cell system of this form of implementation can eliminate the excessively wet state by increasing the amount of reactant gas, and when the fuel cell is in the excessively dry state, this fuel cell system can eliminate the excessively dry state by decreasing the amount of reactant gas.

The fuel cell system of the above form of implementation may further include a gas control unit that controls the reactant gas supply section. The gas control unit may, by using the reactant gas supply section, increase the stoichiometric ratio of the reactant gas supplied to the fuel cell, when the first inference unit has inferred that the wet state is the excessively wet state, and decrease the stoichiometric ratio of the reactant gas supplied to the fuel cell, when the first inference unit has inferred that the wet state is the excessively dry state.

When the fuel cell is in the excessively wet state, the fuel cell system of this form of implementation can eliminate the excessively wet state by increasing the stoichiometric ratio of the reactant gas, and when the fuel cell is in the excessively dry state, this fuel cell system can eliminate the excessively dry state by decreasing the stoichiometric ratio of the reactant gas.

The fuel cell system of the above form of implementation may further include an output control unit that controls the output current of the fuel cell. The output control unit may decrease the output current when the first inference unit has inferred that the wet state is the excessively wet state, and may increase the output current when the first inference unit has inferred that the wet state is the excessively dry state.

When the fuel cell is in the excessively wet state, the fuel cell system of this form of implementation can eliminate the excessively wet state by decreasing the output current, and when the fuel cell is in the excessively dry state, this fuel cell system can eliminate the excessively dry state by increasing the output current.

The fuel cell system of the above form of implementation may further include: a storage unit that stores a relation between an amount of moisture inside the fuel cell and the phase difference; and a second inference unit that infers the amount of moisture inside the fuel cell with reference to the relation stored in the storage unit by using the phase difference derived by the phase difference deriving unit.

As long as the wet state of the fuel cell is appropriate, the fuel cell system of this form of implementation can learn the wet state of the fuel cell by using the phase difference derived by the phase difference deriving unit.

A method for inferring a wet state of a fuel cell in a fuel cell system including the fuel cell is provided as other form of implementation of the present disclosure. This method includes: superimposing an alternating-current signal on one of a current and a voltage taken out from the fuel cell toward a load; extracting an alternating-current component from an output of the fuel cell, and deriving a phase difference that is a phase lag of an alternating-current voltage relative to an alternating current in the alternating-current component; and inferring that the wet state of the fuel cell is an inappropriate wet state corresponding to an excessively wet state or an excessively dry state, when an absolute value of an amount of change in the phase difference has become equal to or larger than a predetermined criterion value for the phase difference immediately after a magnitude of a change in a value of at least one of parameters that are a flow rate of a reactant gas supplied to the fuel cell, a stoichiometric ratio of the reactant gas, and an output current of the fuel cell is determined to have exceeded a predetermined criterion.

The present disclosure can be realized in various forms of implementation. Examples of such forms of implementation include a control method of a fuel cell system, a computer program that realizes this control method, and a non-transitory recording medium that stores this computer program.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein:

FIG. 4 is a graph showing a relation between a cathode stoichiometric ratio and the phase difference $\theta$;

FIG. 6 is a table showing examples of assumed operation states of the fuel cell;

DETAILED DESCRIPTION OF EMBODIMENTS

A. First Embodiment (A-1) Configuration of Fuel Cell System

Figure 1:
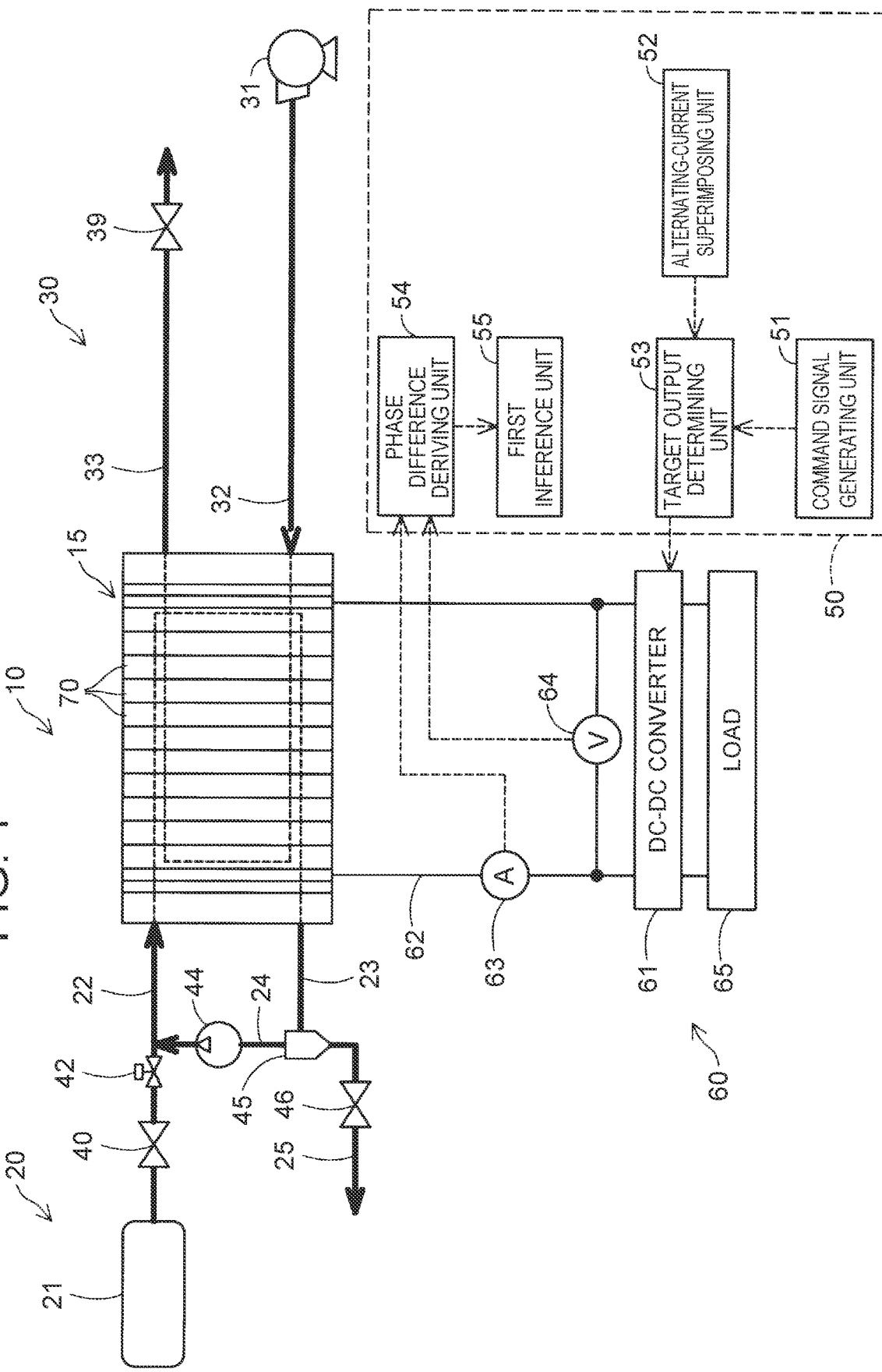
FIG. 1 is a diagram showing a schematic configuration of a fuel cell system.

FIG. 1 is a diagram showing a schematic configuration of a fuel cell system 10 as a first embodiment of the present disclosure. For example, the fuel cell system 10 can be installed in an electric vehicle and used as a driving power source. Alternatively, the fuel cell system 10 can also be used as a stationary power source. The fuel cell system 10 of this embodiment includes a fuel cell 15, a fuel gas supply section 20, an oxidation gas supply section 30, and a controller 50. A power circuit 60 is connected to the fuel cell 15. The fuel gas supply section 20 and the oxidation gas supply section 30 will also be referred to as reactant gas supply sections.

The fuel cell 15 is a polymer electrolyte fuel cell. The fuel cell 15 has a stack structure in which a plurality of single cells 70 as electricity generating bodies is stacked, and generates electricity by being supplied with a fuel gas containing hydrogen and an oxidation gas containing oxygen. The fuel gas and the oxidation gas are gases used for electrochemical reactions, and will also be referred to as reactant gases.

The single cell 70 includes a membrane-electrode assembly (MEA), a pair of gas diffusion layers disposed so as to sandwich the MEA, and a pair of gas separators disposed respectively on outer sides of the gas diffusion layers. The MEA includes an electrolyte membrane, and an anode and a cathode that are catalytic electrode layers formed respectively on surfaces of the electrolyte membrane. In each single cell 70, a flow passage through which the fuel gas flows (anode-side flow passage) is formed on the anode side, and a flow passage through which the oxidation gas flows (cathode-side flow passage) is formed on the cathode side, with the electrolyte membrane interposed therebetween.

The electrolyte membrane constituting part of the MEA is an ion-exchange membrane having proton conductivity that is formed by a solid polymer material, for example, fluorine-based resin, and exhibits good electron conductivity in a wet state. The cathode and the anode are layers formed on the electrolyte membrane, and include carbon particles carrying catalytic metal (e.g., platinum) that promotes electrochemical reactions, and a polymer electrolyte having proton conductivity. The gas diffusion layer is formed by a member having gas permeability and electron conductivity, examples of which include a metal member, such as foam metal or metal mesh, or a carbon member, such as carbon cloth or carbon paper. The gas separator can be formed by a gas-impermeable conductive member, for example, a carbon member, such as a dense carbon member formed by compressing carbon so as to be impermeable to gas, or a metal member, such as a stainless steel member formed by pressing.

A refrigerant flow passage through which a refrigerant for cooling the fuel cell 15 flows is formed inside the fuel cell 15, but this refrigerant flow passage and a refrigerant system for circulating the refrigerant through the refrigerant flow passage are not shown in FIG. 1.

The fuel gas supply section 20 includes a fuel gas tank 21, a fuel gas supply pipe 22, a fuel gas discharge pipe 23, a fuel gas return pipe 24, a main stop valve 40, a variable pressure regulating valve 42, a gas-liquid separator 45, and a hydrogen pump 44. The fuel gas tank 21 is a storage device that stores a hydrogen gas as the fuel gas, and is connected to the anode-side flow passage of the fuel cell 15 through the fuel gas supply pipe 22. The main stop valve 40 and the variable pressure regulating valve 42 are provided on the fuel gas supply pipe 22, in this order from the side closer to the fuel gas tank 21. The variable pressure regulating valve 42 is a pressure regulating valve that can regulate the pressure of hydrogen (the amount of hydrogen) supplied from the fuel gas tank 21 to the fuel cell 15.

The fuel gas discharge pipe 23 is a flow passage through which an anode off-gas discharged from the fuel cell 15 flows. The fuel gas return pipe 24 is connected to the fuel gas discharge pipe 23 and to a portion of the fuel gas supply pipe 22 downstream of the variable pressure regulating valve 42. The anode off-gas discharged from the fuel cell 15 to the fuel gas discharge pipe 23 is guided to the fuel gas supply pipe 22 again via the fuel gas return pipe 24. Thus, in the fuel cell system 10, the fuel gas circulates through the fuel gas discharge pipe 23, the fuel gas return pipe 24, part of the fuel gas supply pipe 22, and the fuel gas flow passage formed inside the fuel cell 15, while hydrogen is consumed by electricity generation. The hydrogen pump 44 is provided on the fuel gas return pipe 24, to generate a force for driving the fuel gas to circulate through the flow passages and adjust the flow rate of the fuel gas.

The gas-liquid separator 45 is provided at a junction between the fuel gas discharge pipe 23 and the fuel gas return pipe 24. The anode off-gas contains impurities, such as nitrogen and steam, along with hydrogen that has not been consumed by electricity generation. The gas-liquid separator 45 separates water and gas (hydrogen and nitrogen etc.) contained in the anode off-gas. In this embodiment, impurities are removed from the fuel gas circulating through the above-described flow passages by the gas-liquid separator 45. The fuel gas discharge pipe 25 is connected to the gas-liquid separator 45, and a purge valve 46 is provided on the fuel gas discharge pipe 25. As the purge valve 46 is opened, water and gas are discharged from the gas-liquid separator 45.

The oxidation gas supply section 30 includes an air compressor 31, an oxidation gas supply pipe 32, an oxidation gas discharge pipe 33, and a back pressure valve 39. The fuel cell system 10 of this embodiment uses air as the oxidation gas. The air compressor 31 compresses air, and supplies the compressed air to the cathode-side flow passage of the fuel cell 15 through the oxidation gas supply pipe 32. The oxidation gas supply pipe 32 connects the air compressor 31 and the fuel cell 15 to each other and supplies the oxidation gas to the fuel cell 15. A cathode off-gas discharged from the fuel cell 15 is discharged to an outside of the fuel cell system 10 through the oxidation gas discharge pipe 33. The back pressure valve 39 is provided on the oxidation gas discharge pipe 33, and the pressure of the oxidation gas inside the fuel cell 15 is adjusted as the degree of opening of the back pressure valve 39 is adjusted.

In the power circuit 60, the fuel cell 15 is connected to a load 65 through a line 62. A DC-DC converter 61 is provided on the line 62. When electricity is supplied from the fuel cell 15 to the load 65, the DC-DC converter 61 raises an output voltage of the fuel cell 15 to a voltage that can be used in the load 65. In this embodiment, the DC-DC converter 61 takes out a current and a voltage from the fuel cell 15 toward the load 65, and switching control of the DC-DC converter 61 is performed to thereby control the current and the voltage taken out from the fuel cell 15. When the fuel cell system 10 is used as a power source for driving a vehicle, the load 65 can include at least a driving motor of the vehicle. A current sensor 63 and a voltage sensor 64 are provided on the line 62, and an output current and an output voltage of the fuel cell 15 can be measured with these sensors.

The controller 50 is configured as a logic circuit centered around a microcomputer, and specifically includes: a CPU that executes computations etc. in accordance with a preset control program; an ROM in which a control program, control data, etc. required for the CPU to execute various computation processes are stored in advance; an RAM into which similarly various data required for the CPU to perform various computation processes are temporarily read and written; and input and output ports through which various signals are input and output. The controller 50 controls the fuel cell system 10 when the fuel cell system 10 generates electricity to be output to the power circuit 60. The controller 50 outputs driving signals to the air compressor 31, the back pressure valve 39, the main stop valve 40, the variable pressure regulating valve 42, the hydrogen pump 44, the purge valve 46, the DC-DC converter 61, etc. In addition, the controller 50 acquires detection signals from the current sensor 63, the voltage sensor 64, etc.

In FIG. 1, the controller 50 is represented by functional blocks each representing part of the functions executed by the controller 50. Specifically, the controller 50 includes, as the functional blocks, a command signal generating unit 51, an alternating-current superimposing unit 52, a target output determining unit 53, a phase difference deriving unit 54, and a first inference unit 55.

When the fuel cell 15 generates electricity, the controller 50 outputs driving signals (not shown) to relevant parts of the fuel gas supply section 20 and the oxidation gas supply section 30, so that such amounts of fuel gas and oxidation gas as allow generation of an amount of electricity according to a load demand are supplied to the fuel cell 15. Then, based on the load demand for the fuel cell 15, the command signal generating unit 51 of the controller 50 generates a command signal (a voltage command value and a current command value) to be output to the DC-DC converter 61 in order to draw from the fuel cell 15 an amount of electricity meeting the demanded load. The alternating-current superimposing unit 52 of the controller 50 generates a superimposing signal for superimposing an alternating-current signal on the current or the voltage taken out from the fuel cell 15 by the DC-DC converter 61. While the alternating-current signal can be superimposed on both of the current and the voltage taken out from the fuel cell 15 by the DC-DC converter 61, in the subsequent description, the alternating-current signal is superimposed on the current. The target output determining unit 53 receives an input of the command signal and the superimposing signal, determines a target voltage and a target current for the fuel cell 15, and outputs a driving signal for obtaining the determined target voltage and target current to the DC-DC converter 61. In this embodiment, the phase difference deriving unit 54 of the controller 50 acquires detection signals from the current sensor 63 and the voltage sensor 64, extracts an alternating-current component from the output of the fuel cell 15, and derives a phase difference that is a phase lag of the alternating-current voltage relative to the alternating current in the extracted alternating-current component. Thereafter, the first inference unit 55 infers the wet state of the fuel cell 15 by using an amount of change in the phase difference acquired from the phase difference deriving unit 54. The action of inferring the wet state will be described in detail later.

(A-2) Relation Between Wet State of Fuel Cell and Phase Difference

Figure 2:
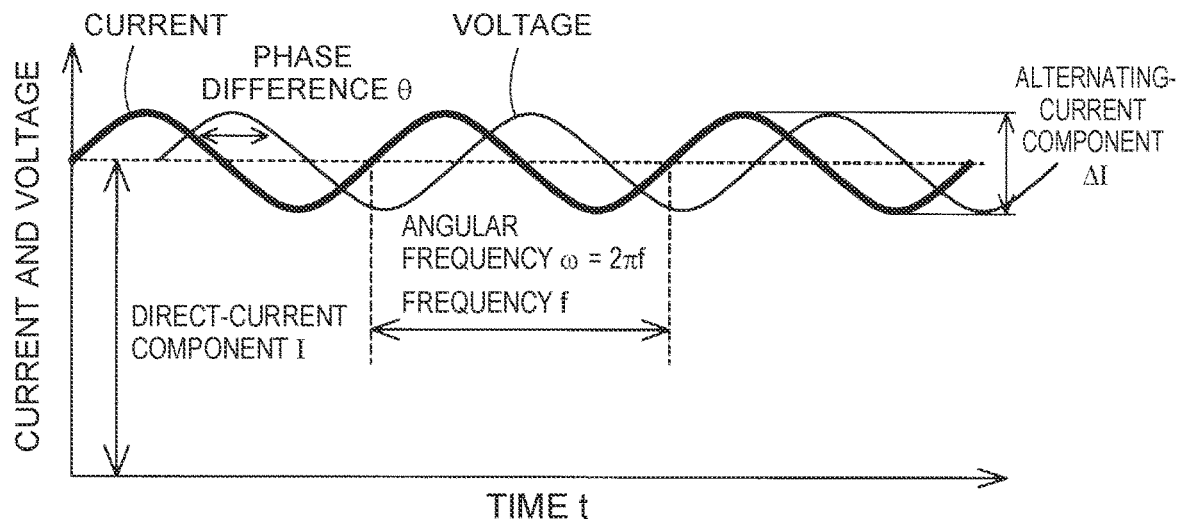
FIG. 2 is a graph showing a phase difference $\theta$ obtained by superimposing an alternating-current signal on an output current of a fuel cell.

FIG. 2 is a graph showing that a phase lag of an alternating-current voltage relative to an alternating current in an alternating-current component of an output of the fuel cell 15 obtained by superimposing an alternating-current signal (alternating-current component $\Delta I$) on an output current (direct-current component I) of the fuel cell 15, is a phase difference $\theta$. The impedance in the fuel cell 15 can be regarded as the sum of a resistance (resistance to movement) and a capacitive reactance. In such a fuel cell having a capacitive component inside, a relation in which a voltage change occurs later than a current change (in other words, a current change occurs earlier than a voltage change) generally holds regardless of the wet state inside the fuel cell. The phase difference $\theta$ is expressed by the following Formula (1):

$$\theta = \tan^{-1}(X/R) \quad (1)$$

(X represents a capacitive reactance and R represents a resistance.)

Figure 3:
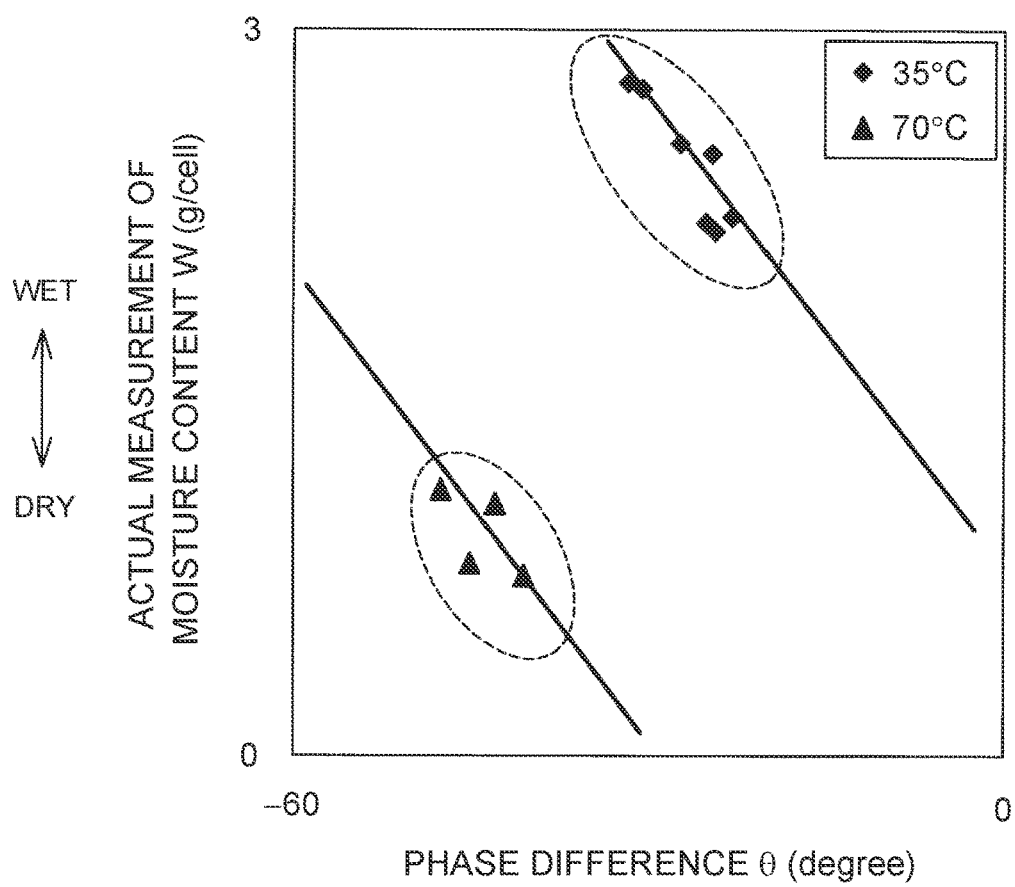
FIG. 3 is a graph showing an example of a relation between a wet state (moisture content) and the phase difference $\theta$.

FIG. 3 is a graph showing an example of a result of a study on the relation between the wet state (moisture content) and the phase difference $\theta$ in the fuel cell 15. Here, an alternating-current signal of 20 Hz was superimposed on a current taken out from the fuel cell 15, while the temperature of the fuel cell 15 was controlled to be constant at 35° C. or 70° C. and the moist state of the fuel cell 15 was changed variously. Then, the phase difference $\theta$ in an alternating-current component of an output of the fuel cell 15 was derived, and the relation between an actual measurement of a moisture content W of the fuel cell 15 and the phase difference $\theta$ was studied. The temperature of the fuel cell 15 was adjusted by adjusting the temperature of the refrigerant circulating inside the fuel cell 15. The moisture content of the fuel cell 15 was obtained as follows: While the fuel cell 15 was generating electricity, with the temperature of the fuel cell 15 set to 35° C. or 70° C. and the moist state of the fuel cell 15 set to various states, the DC-DC converter 61 was operated such that an alternating-current signal was superimposed on a current taken out from the fuel cell 15 by the DC-DC converter 61. An alternating-current component of an output of the fuel cell 15 was extracted and the phase difference $\theta$ was derived, and then the fuel cell 15 was disassembled and dried. The masses of the fuel cell 15 before and after drying were measured, and the difference between the masses before and after drying was used as the moisture content of the fuel cell 15. The measurement result is plotted in FIG. 3, in which the horizontal axis shows the phase difference $\theta$ and the vertical axis shows the actual measurement of the moisture content. As shown in FIG. 3, in each of the cases where the temperature of the fuel cell 15 was 35° C. and 70° C., respectively, a correlation between the moisture content of the fuel cell 15 and the phase difference $\theta$ in which the value of the phase difference $\theta$ increases as drying progresses has been recognized.

What it takes to observe the above correlation between the wet state of the fuel cell 15 and the phase difference $\theta$, an alternating-current signal of a frequency within a range of 1 to 100 Hz may be superimposed on a current taken out from the fuel cell 15. If an alternating-current signal of a higher frequency is superimposed on a current taken out from the fuel cell 15, the resulting impedance will be composed mostly of a resistance component representing a resistance to the movement of electrical charges. Thus, it can be said that superimposing an alternating-current signal of a higher frequency results in relatively low sensitivity to excessive wetness involving hindrance to the movement of gas. Conversely, if an alternating-current signal of a lower frequency is superimposed, the resulting impedance will include not only a resistance component but also a reactance reflecting a resistance to the movement of gas. In this embodiment, therefore, an alternating-current signal having a frequency within the above-mentioned range at which a reactance can be obtained with sufficient measurement accuracy, is used to determine the wet state of the fuel cell 15 by superimposing an alternating-current signal on a current taken out from the fuel cell 15. Hereinafter, an alternating-current signal of 1 to 100 Hz to be superimposed on a current taken out from the fuel cell 15 to infer the wet state will also be referred to simply as a "low-frequency alternating-current signal." The low-frequency alternating-current signal has a frequency of preferably not lower than 5 Hz and more preferably not lower than 10 Hz.

FIG. 4 is a graph showing a result of measuring the phase difference $\theta$ while the output current of the fuel cell 15 and the fuel gas flow rate were held constant and the cathode stoichiometric ratio was varied by varying the oxidation gas flow rate. In FIG. 4, the horizontal axis shows the cathode stoichiometric ratio and the vertical axis shows the phase difference $\theta$. The cathode stoichiometric ratio is the ratio of an amount of oxidation gas actually supplied to the fuel cell to a required amount of oxidation gas theoretically calculated from the output current. When the output current is constant, as the cathode stoichiometric ratio increases, the oxidation gas flow rate increases and the amount of moisture carried away from the fuel cell 15 by the oxidation gas increases, so that drying progresses inside the fuel cell 15. As the stoichiometric ratio decreases, the oxidation gas flow rate decreases and the amount of moisture carried away from the fuel cell 15 by the oxidation gas decreases, so that wetting progresses inside the fuel cell 15. If the relation in which the value of the phase difference $\theta$ increases as drying progresses as shown in FIG. 3 always exists, it should follow that the value of the phase difference $\theta$ becomes larger as the cathode stoichiometric ratio increases. However, as shown in FIG. 4, it has been confirmed that this relation does not always exist. For example, the values of the phase difference θ are almost the same at a point a1 and a point a3, or at a point a2 and a point a4, at which the cathode stoichiometric ratios are different from each other and therefore the wet states should be different from each other. This result prompted a more detailed study on the relation between the wet state of the fuel cell 15 and the phase difference θ.

Figure 5A:
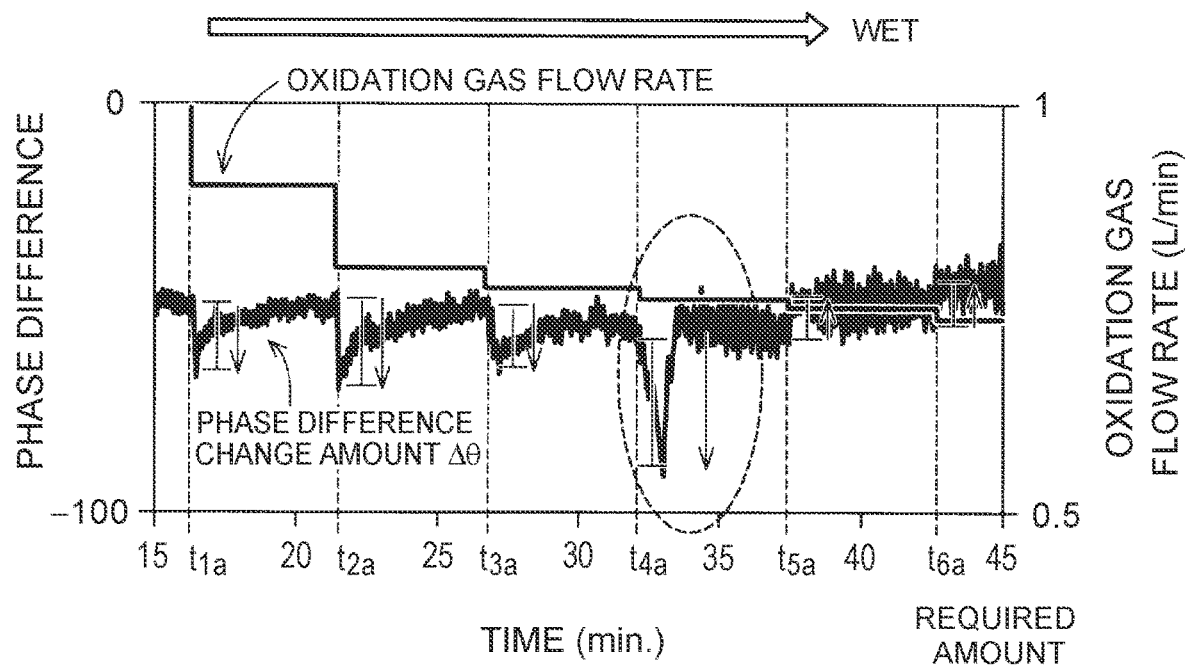
FIG. 5A is a graph showing the phase difference $\theta$ obtained by decreasing an oxidation gas flow rate stepwise.
Figure 5B:
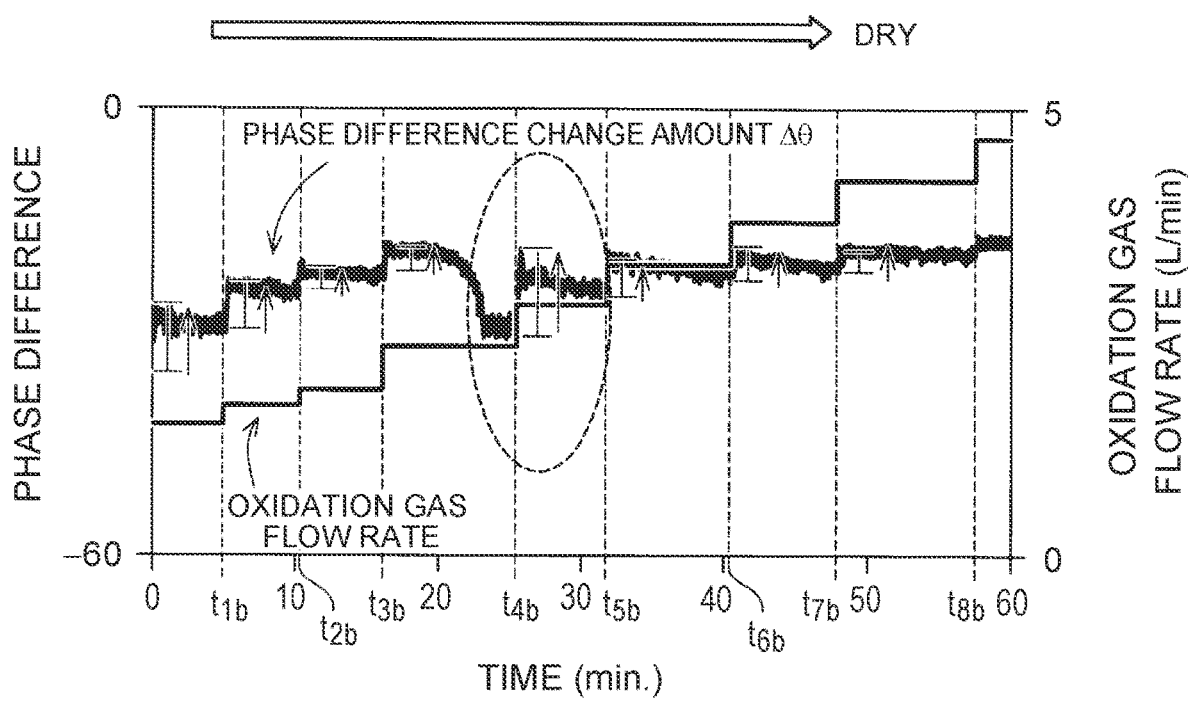
FIG. 5B is a graph showing the phase difference $\theta$ obtained by increasing the oxidation gas flow rate stepwise.

FIG. 5A is a graph showing an example of a result of repeatedly measuring the phase difference θ while decreasing the oxidation gas flow rate stepwise under the condition that the output current of the fuel cell 15 and the fuel gas supply amount were constant. In the subsequent description, certain time intervals at which the phase difference θ is repeatedly measured will also be referred to as measurement periods. When the oxidation gas flow rate is thus decreased under the condition that the output current is held constant and therefore the amount of water generated remains constant, wetting progresses in the fuel cell 15 as the amount of moisture carried away from the fuel cell 15 by the oxidation gas decreases with the decreasing oxidation gas flow rate. In FIG. 5A, and FIG. 5B to be described later, an alternating-current signal of 20 Hz was superimposed on a current taken out from the fuel cell 15, and the phase difference θ was repeatedly measured at one-second intervals (once every one-second measurement period). In FIG. 5A, the oxidation gas flow rate was decreased stepwise at times $t_{1a}$, $t_{2a}$, $t_{3a}$, $t_{4a}$, $t_{5a}$, and $t_{6a}$. At times $t_{1a}$, $t_{2a}$, $t_{3a}$, and $t_{4a}$, the value of the phase difference θ decreased relatively significantly immediately after the oxidation gas flow rate was decreased, by a large amount of change compared with an amount of change per measurement period of the phase difference θ when the oxidation gas flow rate was constant. Between time $t_{1a}$ and time $t_{4a}$, the value of the phase difference θ showed a slightly decreasing trend as a whole. By contrast, at times $t_{5a}$ and $t_{6a}$ at which wetting is considered to have further progressed, the value of the phase difference θ rose immediately after the oxidation gas flow rate was decreased, by a large amount of change compared with an amount of change per measurement period of the phase difference θ when the oxidation gas flow rate was constant. From time $t_{4a}$ onward, the value of the phase difference θ showed a gently increasing trend as a whole. In FIG. 5A, the amounts of change in the phase difference θ at times $t_{1a}$, $t_{2a}$, $t_{3a}$, and $t_{4a}$ are indicated by the downward arrows, and the amounts of change in the phase difference θ at times $t_{5a}$ and $t_{6a}$ are indicated by the upward arrows.

As described above, until wetting has progressed to some degree, the value of the phase difference θ decreases immediately after the oxidation gas flow rate is decreased stepwise, by a larger amount of change than the amount of change per measurement period of the phase difference θ when the oxidation gas flow rate is constant. In particular, it has been recognized that there is a point at which the magnitude of the decrease in the value of the phase difference θ resulting from a decrease in the oxidation gas flow rate is especially large, such as immediately after time $t_{4a}$. In FIG. 5A, this point is encircled by the dashed line. It has been found that the aspect of reaction of the value of the phase difference θ to the wet state of the fuel cell 15 changes significantly around this point. A possible explanation for this is that when wetting progresses beyond the above-described point, the resistance to the movement of gas increases rapidly due to an excessive liquid water, which causes a significant change in the correlation existing between the value of the phase difference θ and the wet state.

In this embodiment, a state where wetting has thus progressed and the correlation existing between the value of the phase difference θ and the wet state has been disrupted will be referred to as an "excessively wet state." Also when, unlike in the case of FIG. 5A, the oxidation gas flow rate decreases gradually and wetting progresses gradually, an excessively wet state that causes a significant change in the correlation existing between the value of the phase difference θ and the wet state is presumed to arise eventually. In this case, however, it is difficult to recognize that the excessively wet state has arisen gradually, from the fact that the amount of change in the phase difference θ has become larger. As shown in FIG. 5A, when the excessively wet state arises as the oxidation gas flow rate decreases significantly in a state where wetting has progressed to some degree in the fuel cell 15, an especially large amount of change, specifically decrease, in the value of the phase difference θ occurs. Therefore, if a large decrease in the value of the phase difference θ can be recognized when the oxidation gas flow rate has decreased significantly, it can be inferred that an excessively wet state that disrupts the correlation existing between the value of the phase difference θ and the wet state has arisen.

FIG. 5B is a graph showing an example of a result of repeatedly measuring the phase difference θ while the oxidation gas flow rate was increased stepwise under the condition that the output current of the fuel cell 15 and the fuel gas supply amount were constant. When the oxidation gas flow rate is thus increased under the condition that the output current is held constant and therefore the amount of water generated remains constant, drying progresses in the fuel cell 15 as the amount of moisture carried away from the fuel cell 15 by the oxidation gas increases with the increasing oxidation gas flow rate.

In FIG. 5B, the oxidation gas flow rate was increased stepwise at times $t_{1b}$, $t_{2b}$, $t_{3b}$, $t_{4b}$, $t_{5b}$, $t_{6b}$, $t_{7b}$, and $t_{8b}$. The value of the phase difference θ rose immediately after the oxidation gas flow rate was increased, by a large amount of change compared with an amount of change per measurement period of the phase difference θ when the oxidation gas flow rate was constant. The value of the phase difference θ showed an increasing trend as a whole up to time $t_{4b}$, but showed a hardly increasing trend as a whole after time $t_{4b}$. In FIG. 5B, the amounts of change in the phase difference θ at times $t_{1b}$, $t_{2b}$, $t_{3b}$, $t_{4b}$, $t_{5b}$, $t_{6b}$, $t_{7b}$, and $t_{8b}$ are indicated by the upward arrows.

As described above, the value of the phase difference θ increases immediately after the oxidation gas flow rate increases rapidly, by a larger amount of change than the amount of change per measurement period of the phase difference θ when the oxidation gas flow rate is constant. In particular, it has been recognized that there is a point at which the magnitude of the increase in the value of the phase difference θ resulting from an increase in the oxidation gas flow rate is especially large, such as immediately after time $t_{4b}$. In FIG. 5B, this point is encircled by the dashed line. It has been found that the aspect of the reaction of the value of the phase difference θ to the wet state of the fuel cell 15 changes significantly around this point. A possible explanation for this is that when drying progresses beyond the above-described point, the resistance to the movement of electrical charges increases rapidly due to drying of the electrolyte membrane, which causes a significant change in the correlation existing between the value of the phase difference θ and the wet state. In this embodiment, a state where drying has thus progressed and the correlation existing between the value of the phase difference θ and the wet state has been disrupted will be referred to as an "excessively dry condition." Also when, unlike in the case of FIG. 5B, the oxidation gas flow rate increases gradually and dryness progresses gradually, an excessively dry state that causes a significant change in the correlation existing between the value of the phase difference θ and the wet state is presumed to arise eventually. In this case, however, it is difficult to recognize that the excessively dry state has arisen gradually, from the fact that the amount of change in the phase difference θ has become larger. As shown in FIG. 5B, when the excessively dry state arises as the oxidation gas flow rate increases significantly in a state where drying has progressed to some degree in the fuel cell 15, an especially large amount of change, specifically increase, in the value of the phase difference θ occurs. Therefore, if a large increase in the value of the phase difference θ can be recognized when the oxidation gas flow rate has increased significantly, it can be inferred that an excessively dry state that disrupts the correlation existing between the value of the phase difference θ and the wet state has arisen.

Thus, the inventor of the present application has discovered as new knowledge that the value of the phase difference θ changes especially significantly when an excessively wet state arises as the oxidation gas flow rate decreases significantly in a state where wetting has progressed to some degree in the fuel cell 15, or when an excessively dry state arises as the oxidation gas flow rate increases significantly in a state where drying has progressed to some degree in the fuel cell 15. An excessively wet state and an excessively dry state will also be collectively referred to as an inappropriate wet state. Any state that does not correspond to an inappropriate wet state will also be referred to as an appropriate wet state. It is possible that the fuel cell 15 may shift into an inappropriate wet state also in cases other than when the oxidation gas flow rate increases or decreases significantly. This will be described below.

FIG. 6 is a table showing examples of assumed operation states of the fuel cell 15. In FIG. 6, Operation States 1 to 3 are shown as examples of operation states of the fuel cell 15. Here, the flow rate of the reactant gas that is at least one of the fuel gas and the oxidation gas (hereinafter also referred to as simply as a gas flow rate), a stoichiometric ratio, and the output current are listed as factors contributing to variation in the wet state of the fuel cell 15.

Operation State 1 is an operation state where the stoichiometric ratio is held constant or within a certain range, while the output current of the fuel cell 15 varies and the gas flow rate of the reactant gas also varies such that the stoichiometric ratio is maintained according to the variation in the output current. Under normal operation conditions, the fuel cell system 10 of this embodiment adopts Operation State 1, with the stoichiometric ratio set to 1 or higher. In Operation State 1, the output current varies according to the variation in the load demand for the fuel cell 15. The gas flow rate also varies according to the variation in the load demand such that a desired amount of current can be output. As for the gas flow rate, both the fuel gas flow rate and the oxidation gas flow rate may be varied according to the load demand, or mainly the flow rate of one of the reactant gases may be varied according to the output current while the variation in the flow rate of the other reactant gas is restricted.

In Operation State 1, when the gas flow rate increases rapidly, the output current also increases rapidly. In this case, the increased gas flow rate causes an increase in the amount of moisture carried away from the fuel cell 15, and the increased output current causes an increase in the amount of water generated. In Operation State 1, when the gas flow rate decreases rapidly, the output current also decreases rapidly. In this case, the decreased gas flow rate causes a decrease in the amount of moisture carried away from the fuel cell 15, and the decreased output current causes a decrease in the amount of water generated. Thus, in Operation State 1, any of a rapid increase and a rapid decrease in the gas flow rate and a rapid increase and a rapid decrease in the output current leads to an excessively dry state in some cases and an excessively wet state in other cases inside the fuel cell 15. Specifically, an excessively dry state arises in some cases and an excessively wet state arises in other cases, depending on various factors including the levels of the gas flow rate and the output current, the speeds of changes in the gas flow rate and in the output current, and the temperature of the fuel cell 15.

Operation State 2 is an operation state where the gas flow rate varies for some reason and consequently the stoichiometric ratio also varies, in a state where the output current of the fuel cell 15 is held constant or within a certain range. As for the gas flow rate, both the fuel gas flow rate and the oxidation gas flow rate vary in some cases, and in other cases mainly the flow rate of one of the reactant gases varies while the variation in the flow rate of the other reactant gas is restricted. The results shown in FIG. 5A and FIG. 5B are results of executing operation control by simulating Operation State 2, with the oxidation gas serving as the varying reactant gas.

In Operation State 2, when the gas flow rate increases rapidly, the stoichiometric ratio also increases rapidly. In this case, the fuel cell 15 tends to shift into an excessively dry state as the amount of moisture carried away from the fuel cell 15 increases relative to the amount of water generated. In Operation State 2, when the gas flow rate decreases rapidly, the stoichiometric ratio also decreases rapidly. In this case, the fuel cell 15 tends to shift into an excessively wet state as the amount of moisture carried away from the fuel cell 15 decreases relative to the amount of water generated.

Operation State 3 is an operation state where the output current varies for some reason and consequently the stoichiometric ratio also varies, in a state where the flow rate of the gas supplied to the fuel cell 15 is held constant or within a certain range.

In Operation State 3, when the output current increases rapidly, the stoichiometric ratio decreases rapidly. In this case, the fuel cell 15 tends to shift into an excessively wet state as the amount of water generated increases relative to the amount of moisture carried away from the fuel cell 15. In Operation State 3, when the output current decreases rapidly, the stoichiometric ratio increases rapidly. In this case, the fuel cell 15 tends to shift into an excessively dry state as the amount of water generated decreases relative to the amount of moisture carried away from the fuel cell 15.

As described above, various operation states can be adopted for the fuel cell 15. In any operation state, the value of the phase difference θ is presumed to change significantly as shown in FIG. 5A and FIG. 5B, when an excessively wet state arises as wetting that has progressed to some degree further progresses rapidly, or when an excessively dry state arises as drying that has progressed to some degree further progresses rapidly. In this embodiment, therefore, it is inferred that the wet state of the fuel cell has become an inappropriate wet state, when the amount of a change in the value of the phase difference θ has become equal to or larger than a predetermined criterion value after the value of a condition that is presumed to cause a rapid change in the wet state of the fuel cell 15, i.e., the value of at least one of the parameters that are the gas flow rate, the stoichiometric ratio, and the output current, has changed significantly. In the following, this method for inferring an inappropriate wet state will be described in detail.

(A-3) Action of Inferring Inappropriate Wet State of Fuel Cell

Figure 7:
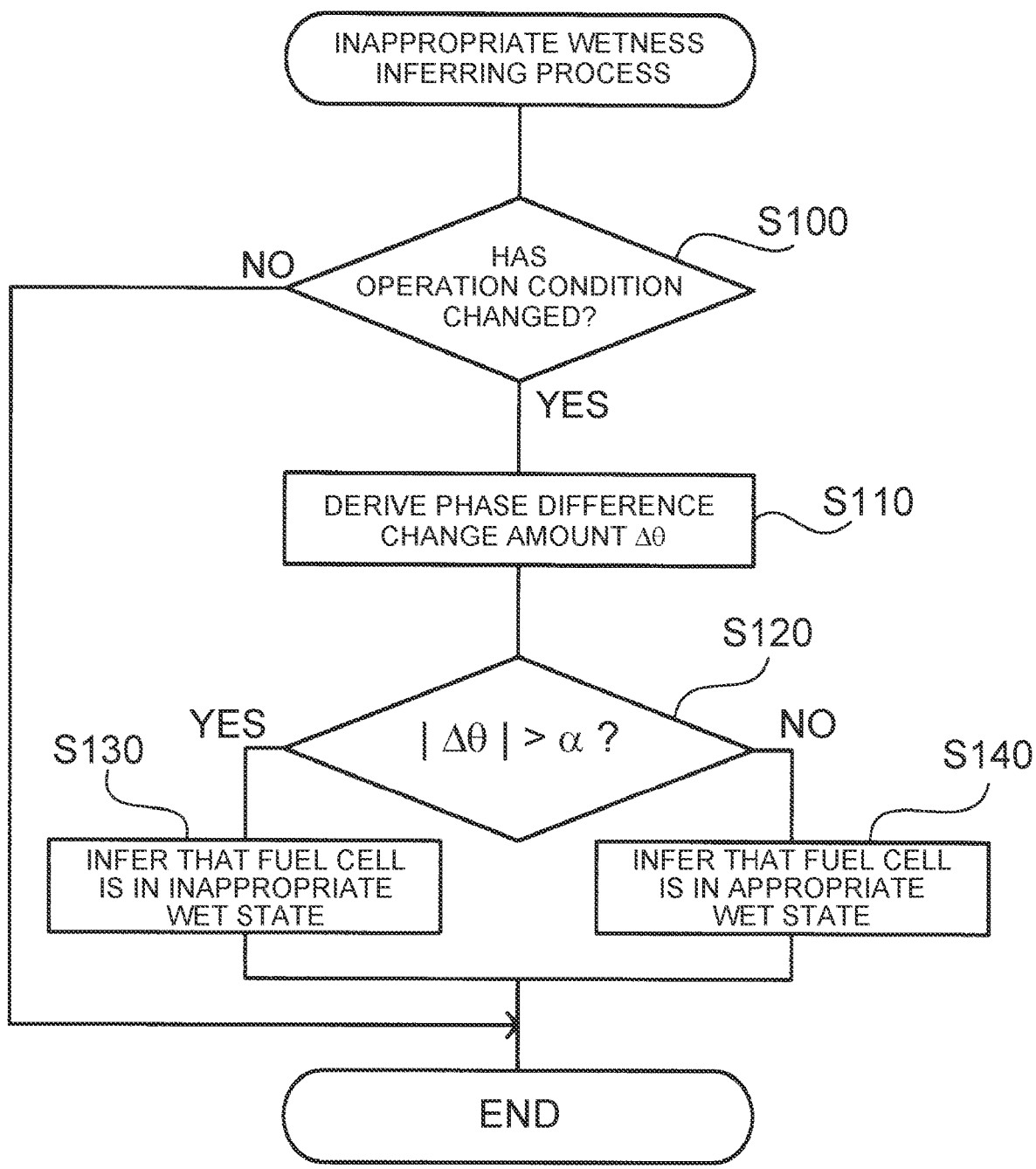
FIG. 7 is a flowchart showing the routine of an inappropriate wetness inferring process.

FIG. 7 is a flowchart showing the routine of an inappropriate wetness inferring process that is repeatedly executed in the CPU of the controller 50 when the fuel cell 15 generates electricity.

When this routine is started, the CPU of the controller 50 determines whether or not an operation condition of the fuel cell 15 has changed (step S100). Specifically, the CPU determines whether or not the magnitude of a change in the value of at least one of the parameters that are the flow rate of the reactant gas (at least one of the fuel gas and the oxidation gas) supplied to the fuel cell 15, the stoichiometric ratio of the reactant gas, and the output current of the fuel cell 15 has exceeded a predetermined criterion. Since the output current of the fuel cell 15 includes an alternating-current component in this embodiment, the output current as the parameter may be a direct-current component of the output current of the fuel cell 15.

Here, the determination in step S100 is made to determine whether or not the magnitude of the change in the value of the parameter shows such a rapid change as can lead to an inappropriate wet state in the fuel cell 15 that can be inferred based on the amount of change in the value of the phase difference $\theta$. In step S100, therefore, the amount of change in the value of the parameter between before and after a predetermined first measurement period is used to determine whether or not the magnitude of the change in the value of the parameter has exceeded the predetermined criterion. The first measurement period is provided to determine whether or not the change in the value of the parameter is rapid, and for example, can be set to a time not shorter than one period of the alternating-current signal to be superimposed on the current taken out from the fuel cell 15. For example, the first measurement period can be set to a time not longer than 10 seconds, preferably not longer than five seconds and more preferably not longer than one second.

In step S100, the magnitude of the change in the value of the parameter can be determined to have exceeded the predetermined criterion, for example, when the amount of change in the value of the parameter during the first measurement period has exceeded a predetermined criterion value for the parameter. For example, in the case where the parameter is the stoichiometric ratio, the magnitude of the change in the value of the parameter can be determined to have exceeded the predetermined criterion, when the amount of change in the value of the stoichiometric ratio during the first measurement period has exceeded a predetermined criterion value for the parameter.

Here, the criterion value for the parameter used when wetting progresses and that used when drying progresses may be the same value or different values. In the case where the parameter is the stoichiometric ratio and the stoichiometric ratio is in an increasing trend, i.e., there is a trend that drying progresses, the criterion value for the parameter can be set to 0.5, for example. In the case where the parameter is the stoichiometric ratio and the stoichiometric ratio is in a decreasing trend, i.e., there is a trend that wetting progresses, the criterion value for the parameter can be set to 0.02, for example. In the case where a low-frequency alternating-current signal is superimposed on a current taken out from the fuel cell 15 as in this embodiment, the phase difference $\theta$ reacts more sensitively to the amount of moisture inside the fuel cell 15 when the inside of the fuel cell 15 becomes excessively wet. Accordingly, a smaller value can be set as the criterion value for the parameter to be used when wetting progresses.

Alternatively, in step S100, the magnitude of the change in the value of the parameter can be determined to have exceeded the predetermined criterion, when the ratio of the amount of change in the value of the parameter during the first measurement period to the value of the parameter at the start of the first measurement period has exceeded a predetermined criterion value for the parameter. For example, in the case where the parameter is the output current, the magnitude of the change in the value of the parameter can be determined to have exceeded the predetermined criterion, when the ratio of the amount of change in the output current during the first measurement period to the value of the output current at the start of the first measurement period has exceeded a predetermined criterion value for the parameter. The criterion value for the parameter when the parameter is the output current can be set to 10%, for example.

To detect the amount of change in the value of the parameter in step S100, when the parameter is the fuel gas flow rate, the fuel gas flow rate may be actually measured with a flow rate sensor provided in a fuel gas flow passage, or may be derived by using an amount of driving of the hydrogen pump 44. When the parameter is the oxidation gas flow rate, for example, the oxidation gas flow rate may be actually measured with a flow rate sensor provided in the oxidation gas flow passage, or may be derived from an amount of driving of the air compressor 31. When the parameter is the output current, the output current may be derived from a command signal generated by the command signal generating unit 51, or may be derived from an actual measurement. In the case where the output current is derived from an actual measurement, the output current can be derived based on a direct-current component extracted from a detection value of the current sensor 63. When the parameter is the stoichiometric ratio, the stoichiometric ratio can be calculated by using a theoretically required gas flow rate calculated from the output current derived as described above, and the flow rate of the reactant gas derived as described above.

When the CPU of the controller 50 determines that the operation condition has not changed in step S100 (step S100: No), the CPU ends the current routine, and when the CPU determines that the operation condition has changed (step S100: Yes), the CPU derives an amount of change $\Delta\theta$ in the phase difference $\theta$ (hereinafter also referred to as the phase difference change amount $\Delta\theta$) immediately after the change in the operation condition (step S110). Specifically, the CPU derives the amount of change in the value of the phase difference $\theta$ during a second measurement period that is immediately after the change in the operation condition. Specifically, in step S110, the CPU derives a phase difference $\theta 1$ by extracting an alternating-current component from an output current value and an output voltage value that are measured immediately after the operation condition is determined to have changed in step S100. Moreover, the CPU derives a phase difference $\theta 2$ by extracting an alternating-current component from an output current value and an output voltage value that are measured at a timing when a predetermined second measurement period has elapsed from the timing of the measurement for deriving the phase difference $\theta 1$. Then, the CPU calculates a difference between the phase difference $\theta 1$ and the phase difference $\theta 2$ as the phase difference change amount $\Delta\theta$ immediately after the change in the operation condition. This action in step S110 is executed by the phase difference deriving unit 54 of the controller 50 (see FIG. 1).

In step S110, the phase difference change amount $\Delta\theta$ is derived to determine whether or not the fuel cell 15 has shifted into an inappropriate wet state, by the magnitude of the change in the phase difference $\theta$ attributable to the change in the operation condition in step S100. Therefore, "immediately after the change in the operation condition in step S100," which is the timing for deriving the phase difference change amount $\Delta\theta$, means a timing after a lapse of "a time taken for the influence of the change in the operation condition to be seen in the amount of change in the value of the phase difference $\theta$ after that change in the operation condition has occurred." For example, when whether or not the operation condition has changed is determined based on the output current in step S100, that time taken for the influence of the change in the operation condition to be seen in the amount of change in the value of the phase difference $\theta$ after that change in the operation condition has occurred, can be set to the time of one period of the alternating-current signal to be superimposed on the current taken out from the fuel cell 15. When whether or not the operation condition has changed is determined based on the gas flow rate in step S100, it may take some time until the flow rate of the gas supplied to the fuel cell 15 actually changes after a change in the gas flow rate is detected, due to the long pipe of the reactant gas to be detected. In this case, the above time can be obtained by measuring the time taken for a change in the gas flow rate to affect the fuel cell 15 through experiment in advance, and then adding the time obtained as the measurement result, for example, to the time of one period of the alternating-current signal to be superimposed on the current taken out from the fuel cell 15. The timing of "immediately after the change in the operation condition" can be set in this way.

In step S110, to obtain the phase difference change amount $\Delta\theta$, the CPU derives the phase difference $\theta 1$ immediately after the change in the operation condition in step S100, and thereafter further derives the phase difference $\theta 2$ after a lapse of the second measurement period. The controller 50 of this embodiment monitors the impedance by performing measurement (hereinafter also referred to as sampling) of the output current value and the output voltage value with certain frequency by using the current sensor 63 and the voltage sensor 64, and extracting an alternating-current component. The frequency with which the output current value and the output voltage value are measured will also be referred to as sampling frequency, and time intervals at which the output current value and the output voltage value are repeatedly measured will also be referred to as sampling periods. The sampling period may be any time that is at least not shorter than one period of the alternating-current signal to be superimposed on the current taken out from the fuel cell 15. When the frequency of the alternating-current signal to be superimposed on the current taken out from the fuel cell 15 is 1 to 100 Hz, the period of the alternating-current signal is 10 to 1000 ms. For example, when the frequency of the alternating-current signal is 20 Hz, the period of the alternating-current signal is 50 ms. The fuel cell system 10 of this embodiment calculates the phase difference change amount $\Delta\theta$ by using an alternating-current component obtained by such sampling. Therefore, the second measurement period that is a time interval at which the phase difference $\theta 1$ and the phase difference $\theta 2$ are derived may be any period that is an integral multiple of the sampling period. For example, the second measurement period can be set to not longer than 10 seconds, preferably not longer than five seconds and more preferably not longer than one second.

After deriving the phase difference change amount $\Delta\theta$ in step S110, the CPU of the controller 50 determines whether or not the absolute value of the phase difference change amount $\Delta\theta$ is equal to or larger than a phase difference criterion value (a predetermined criterion value for the phase difference) $\alpha$ (step S120). The phase difference criterion value $\alpha$ is a predetermined value provided to determine, by the absolute value of the phase difference change amount $\Delta\theta$, whether or not an inappropriate wet state has resulted from the change in the operation condition determined in step S100, as at time $t_{4a}$ of FIG. 5A and time $t_{4b}$ of FIG. 5B. When the absolute value of the phase difference change amount $\Delta\theta$ is larger than the phase difference criterion value $\alpha$ (step S120: Yes), the CPU of the controller 50 infers that the fuel cell 15 is in an inappropriate wet state (step S130), and ends the current routine. When the absolute value of the phase difference change amount $\Delta\theta$ is equal to or smaller than the phase difference criterion value $\alpha$ (step S120: No), the CPU of the controller 50 infers that the fuel cell 15 is in an appropriate wet state (step S140), and ends the current routine. These actions in steps S120 to S140 are executed by the first inference unit 55 of the controller 50 (see FIG. 1).

For example, the phase difference criterion value $\alpha$ can be set according to the fuel cell 15 to be used, by performing an experiment in advance. How to set the phase difference criterion value $\alpha$ will be described as follows: When the operation state of the fuel cell 15 is changed variously, the fuel cell 15 may shift into an inappropriate wet state. For example, when the fuel cell 15 continuously generates electricity with the flow rate of the reactant gas restricted, or continuously generates electricity with a relatively high level of output current, the moisture content of the fuel cell 15 may increase gradually and an excessively wet state may arise. Whether or not the fuel cell 15 has shifted into an inappropriate wet state, such as an excessively wet state, can be learned based on whether or not the output characteristics of the fuel cell 15 have changed. Specifically, when the fuel cell 15 is in an appropriate wet state, the fuel cell 15 shows constant output characteristics with the output current and the output voltage corresponding well to each other. However, when the fuel cell 15 shifts into an inappropriate wet state, the output voltage value decreases relative to the output current value. Therefore, one can reproduce a state preceding an excessively wet state by obtaining an operation condition under which the fuel cell 15 is in a state in which the moisture content of the fuel cell 15 is in an increasing trend and which precedes an excessively wet state, i.e., a state before the output characteristics change and the output voltage value decreases relative to the output current value. In this state preceding an excessively wet state, one can then obtain the phase difference $\theta$ while further promoting wetting by decreasing the flow rate of either of the reactant gases stepwise as shown in FIG. 5A or by increasing the output current stepwise, and can thereby obtain the value of the phase difference change amount $\Delta\theta$ at the time when the trends of the phase difference $\theta$ and the phase difference change amount $\Delta\theta$ change as at time $t_{4a}$ of FIG. 5A.

In the case where the operation state of the fuel cell 15 is changed variously, when, for example, the fuel cell 15 is continuously supplied with the reactant gas at a relatively high level of flow rate, or continuously generates electricity with the output current restricted, the moisture content of the fuel cell 15 may decrease gradually and an excessively dry state may arise. One can reproduce a state preceding an excessively dry state by obtaining an operation condition under which the fuel cell 15 is in a state in which the moisture content of the fuel cell 15 is in a decreasing trend and which precedes an inappropriate wet state, i.e., a state before the output characteristics change and the output voltage value decreases relative to the output current value. In this state preceding an excessively dry state, one can then obtain the phase difference θ while further promoting drying by increasing the flow rate of either of the reactant gases stepwise as shown in FIG. 5B or by decreasing the output current stepwise, and can thereby obtain the value of the phase difference change amount Δθ at the time when the trends of the phase difference θ and the phase difference change amount Δθ change as at time tab of FIG. 5B.

Such an experiment may be performed multiple times to obtain the value of the phase difference change amount Δθ at the time when the trend of the phase difference change amount Δθ changes. Then, for example, the absolute value of an average value of the obtained phase difference change amounts Δθ, or a minimum value of the absolute values of these phase difference change amounts Δθ can be adopted as the phase difference criterion value α. In the case where the absolute value of the phase difference change amount Δθ that leads to an inappropriate wet state varies with the temperature of the fuel cell 15, a different phase difference criterion value α may be set according to the fuel cell temperature. In this case, a relation between the fuel cell temperature and the phase difference criterion value α can be stored in advance as a map in a memory inside the controller 50. Then, in step S120, the temperature of the fuel cell 15 may be measured, and the phase difference criterion value α corresponding to the fuel cell temperature may be selected with reference to this map. For example, the temperature of the fuel cell 15 can be obtained by measuring the temperature of the refrigerant discharged from the fuel cell 15.

The fuel cell system 10 of the embodiment configured as has been described above can infer that the fuel cell 15 has shifted into an inappropriate wet state as the absolute value of the phase difference change amount Δθ exceeds the phase difference criterion value α immediately after the operation condition of the fuel cell 15 has changed. Thus, it is possible to infer that the fuel cell 15 has shifted into an inappropriate wet state by using the phase difference change amount Δθ, even when the correlation between the phase difference θ and the wet state is disrupted as the wet state of the fuel cell 15 becomes inappropriate.

B. Second Embodiment

In the first embodiment, the absolute value of the phase difference change amount Δθ is used to infer that the fuel cell 15 has shifted into an inappropriate wet state. Whether this inappropriate wet state is an excessively wet state or an excessively dry state may be additionally inferred. A configuration for this case will be described as a second embodiment. The fuel cell system 10 in the second embodiment has the same configuration as in the first embodiment, and therefore common parts will be denoted by the same reference signs and a detailed description thereof will be omitted.

Figure 8:
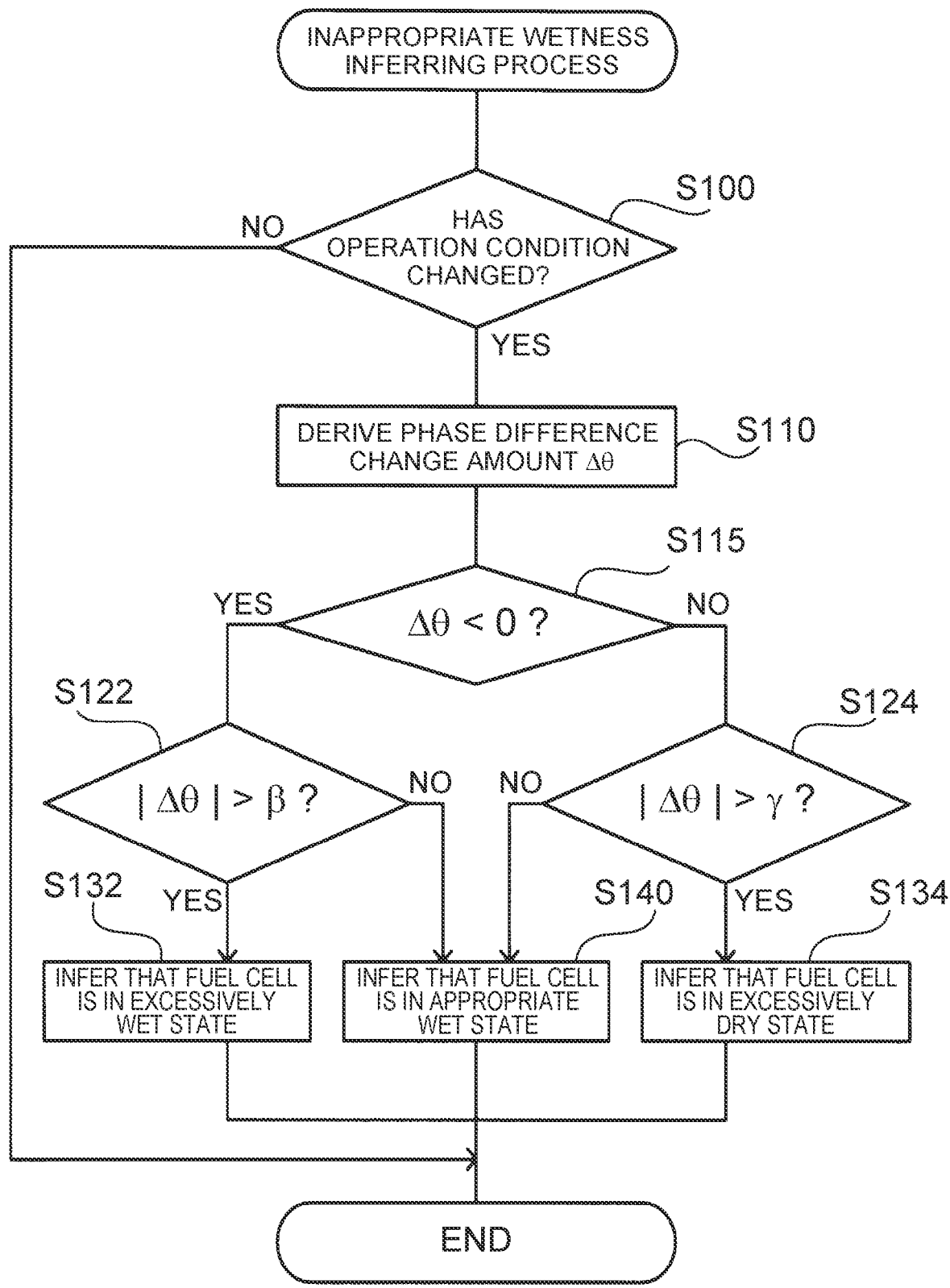
FIG. 8 is a flowchart showing the routine of another inappropriate wetness inferring process.

FIG. 8 is a flowchart showing the routine of an inappropriate wetness inferring process that is repeatedly executed in the CPU of the controller 50 when the fuel cell 15 generates electricity. Those steps that the routine of the inappropriate wetness inferring process of FIG. 8 has in common with that of FIG. 7 will be denoted by the same step numbers and a detailed description thereof will be omitted.

When this routine is started, the CPU of the controller 50 determines whether or not an operation condition of the fuel cell 15 has changed, in the same manner as in FIG. 7 (step S100). When the CPU of the controller 50 determines that the operation condition has changed in step S100 (step S100: Yes), the CPU derives the phase difference change amount Δθ immediately after the change in the operation condition (step S110).

After step S110, the CPU of the controller 50 determines whether or not the phase difference change amount Δθ derived in step S110 is smaller than zero (step S115). When the phase difference change amount Δθ is smaller than zero, i.e., the value of the phase difference θ is in a decreasing trend, the fuel cell 15 can be said to be wetting. When the phase difference change amount Δθ is larger than zero, i.e., the value of the phase difference θ is in an increasing trend, the fuel cell 15 can be said to be drying. When the phase difference change amount Δθ is smaller than zero (step S115: Yes), the CPU of the controller 50 determines whether or not the absolute value of the phase difference change amount Δθ is larger than a phase difference criterion value β (step S122). Like the phase difference criterion value α of the first embodiment, the phase difference criterion value β is a predetermined value provided to determine, by the absolute value of the phase difference change amount Δθ, whether or not an inappropriate wet state (excessively wet state) has resulted from the change in the operation condition. When the absolute value of the phase difference change amount Δθ is larger than the phase difference criterion value β (step S122: Yes), the CPU of the controller 50 infers that the wet state of the fuel cell 15 is an excessively wet state (step S132), and ends the current routine.

When the phase difference change amount Δθ is zero or larger in step S115 (step S115: No), the CPU of the controller 50 determines whether or not the absolute value of the phase difference change amount Δθ is larger than a phase difference criterion value γ (step S124). Like the phase difference criterion value α of the first embodiment, the phase difference criterion value γ is a predetermined value provided to determine, by the absolute value of the phase difference change amount Δθ, whether or not an inappropriate wet state (excessively dry state) has resulted from the change in the operation condition. When the absolute value of the phase difference change amount Δθ is larger than the phase difference criterion value γ (step S124: Yes), the CPU of the controller 50 infers that the wet state of the fuel cell 15 is an excessively dry state (step S134), and ends the current routine.

When the absolute value of the phase difference change amount Δθ is equal to or smaller than the phase difference criterion value β in step S122 (step S122: No), or when the absolute value of the phase difference change amount Δθ is equal to or smaller than the phase difference criterion value γ in step S124 (step S124: No), the CPU of the controller 50 infers that the fuel cell 15 is in an appropriate wet state (step S140), and ends the current routine.

The phase difference criterion value β used in step S122 and the phase difference criterion value γ used in step S124 can be set in the same manner as the phase difference criterion value α of the first embodiment. Specifically, in a state of the fuel cell 15 preceding an excessively wet state, one can obtain the phase difference θ while further promoting wetting by decreasing the flow rate of either of the reactant gases stepwise or by increasing the output current stepwise, and can thereby set, as the phase difference criterion value β, the value of the phase difference change amount Δθ at the time when the trends of the phase difference θ and the phase difference change amount Δθ change. In a state of the fuel cell 15 preceding an excessively dry state, one can obtain the phase difference θ while further promoting drying by increasing the flow rate of either of the reactant gases stepwise or by decreasing the output current stepwise, and can thereby set, as the phase difference criterion value γ, the value of the phase difference change amount Δθ at the time when the trends of the phase difference θ and the phase difference change amount Δθ change.

The fuel cell system 10 having this configuration can not only achieve the same effect as in the first embodiment but also distinguish between an excessively wet state and an excessively dry state when the fuel cell 15 is in an inappropriate wet state. In this case, since the phase difference criterion value β and the phase difference criterion value γ are separately provided, the determinations for both an excessively wet state and an excessively dry state can be made more accurately. The same value may be used as the phase difference criterion value β and the phase difference criterion value γ.

In the second embodiment, as in the first embodiment, the absolute value of the phase difference change amount Δθ is used to determine whether or not the fuel cell 15 is in an inappropriate wet state. Specifically, the absolute value of the phase difference change amount Δθ and the phase difference criterion value are compared. However, "the determination using the absolute value of the phase difference change amount Δθ" is intended to include a determination based on a comparison between a value of the phase difference change amount Δθ that has a sign and a phase difference criterion value that is set according to the value of such a phase difference change amount Δθ, as long as this determination can produce the same result as the determination having been described as the second embodiment. Specifically, for example, the actions in steps S115, S122, and S124 of FIG. 8 can be changed as follows: when the value of the phase difference change amount Δθ derived in step S110 is smaller than −β, the fuel cell 15 may be determined to be in an excessively wet state; when the value of the phase difference change amount Δθ is not smaller than −β nor larger than γ, the fuel cell 15 may be determined to be in an appropriate wet state; and when the value of the phase difference change amount Δθ is larger than γ, the fuel cell 15 may be determined to be in an excessively dry state. Here, the value of the phase difference criterion value β and the value of the phase difference criterion value γ of the second embodiment are represented by "β" and "γ," respectively.

In the case where an excessively wet state and an excessively dry state are distinguished when the fuel cell 15 is in an inappropriate wet state as in the second embodiment, whether the value of the phase difference change amount Δθ is positive or negative may be determined after the absolute value of the phase difference change amount Δθ is determined to be larger than the phase difference criterion value α in step S120 of FIG. 7. When the value of the phase difference change amount Δθ is negative, the inappropriate wet state can be determined to be an excessively wet state, and when the value of the phase difference change amount Δθ is positive, the inappropriate wet state can be determined to be an excessively dry state.

C. Third Embodiment

Figure 9:
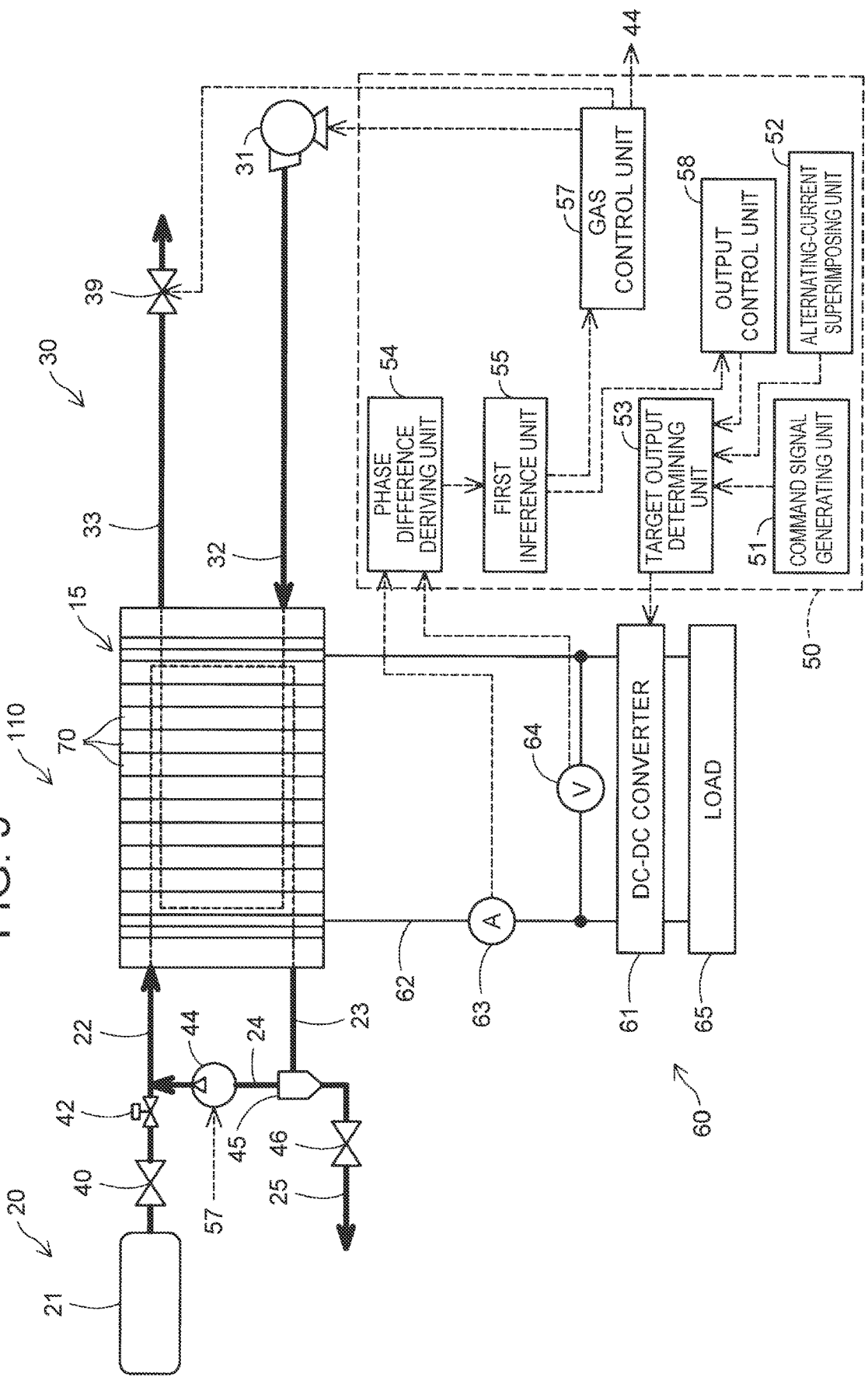
FIG. 9 is a diagram showing a schematic configuration of another fuel cell system.

FIG. 9 is a diagram showing a schematic configuration of a fuel cell system 110 as a third embodiment. The fuel cell system 110 has a configuration similar to that of the fuel cell system 10 in the first embodiment. Therefore, only different parts will be described below while common parts will be denoted by the same reference signs and a detailed description thereof will be omitted. In the third embodiment, when it is inferred that the fuel cell 15 is in the inappropriate wet state, control is performed to eliminate the inappropriate wet state.

The controller 50 of the fuel cell system 110 additionally includes a gas control unit 57 and an output control unit 58 as functional blocks. The gas control unit 57 controls a reactant gas supply state by controlling the reactant gas supply sections (the fuel gas supply section 20 and the oxidation gas supply section 30). The gas control unit 57 outputs a driving signal for increasing or decreasing the fuel gas supply amount to at least one of the variable pressure regulating valve 42 and the hydrogen pump 44. The gas control unit 57 outputs a driving signal for increasing or decreasing the oxidation gas supply amount to the air compressor 31. The output control unit 58 controls the output current of the fuel cell 15, and outputs, to the target output determining unit 53, a command signal for increasing or decreasing the output current of the fuel cell 15 to above or below an output current that is set based on a load demand.

Figure 10:
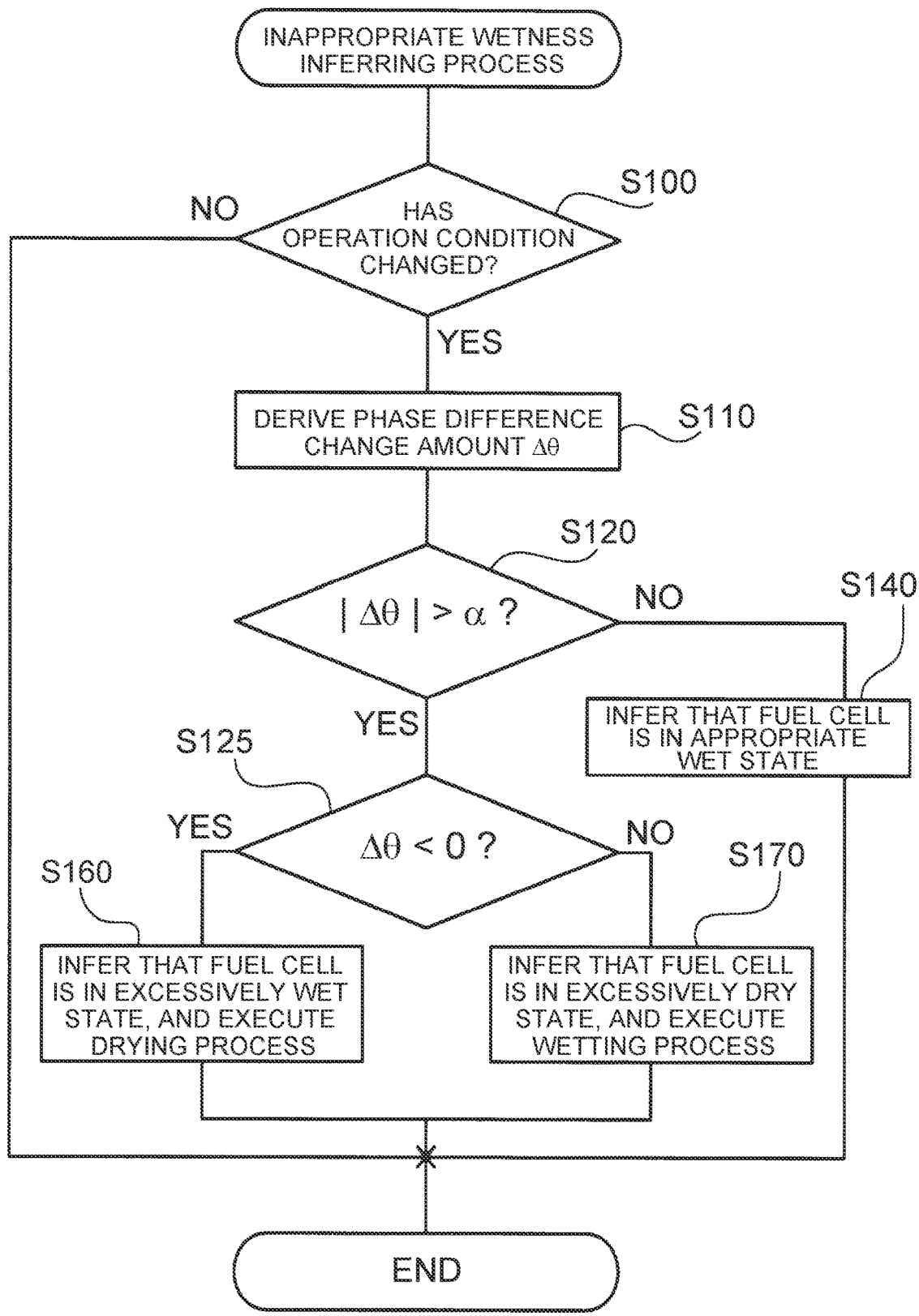
FIG. 10 is a flowchart showing the routine of another inappropriate wetness inferring process.

FIG. 10 is a flowchart showing the routine of an inappropriate wetness inferring process that is repeatedly executed in the CPU of the controller 50 when the fuel cell 15 generates electricity. Those steps that the routine of the inappropriate wetness inferring process of FIG. 10 has in common with that of FIG. 7 will be denoted by the same step numbers and a detailed description thereof will be omitted.

When this routine is started, the CPU of the controller 50 determines whether or not an operation condition of the fuel cell 15 has changed, in the same manner as in FIG. 7 (step S100). When the CPU of the controller 50 determines that the operation condition has changed in step S100 (step S100: Yes), the CPU derives the phase difference change amount Δθ immediately after the change in the operation condition (step S110). Then, the CPU determines whether or not the absolute value of the phase difference change amount Δθ is equal to or larger than the phase difference criterion value α (step S120).

When the absolute value of the phase difference change amount Δθ is larger than the phase difference criterion value α (step S120: Yes), the CPU of the controller 50 determines whether or not the phase difference change amount Δθ derived in step S110 is smaller than zero (step S125). When the phase difference change amount Δθ is smaller than zero (step S125: Yes), the CPU of the controller 50 infers that the wet state of the fuel cell 15 is an excessively wet state and executes a drying process (step S160), and ends the current routine.

When the phase difference change amount Δθ is equal to or larger than zero in step S125 (step S125: No), the CPU of the controller 50 infers that the wet state of the fuel cell 15 is an excessively dry state and executes a wetting process (step S170), and ends the current routine. The action in step S125 is executed by the first inference unit 55 of the controller 50, and the actions in steps S160 and S170 are executed by the gas control unit 57 or the output control unit 58 (see FIG. 9).

The drying process executed in step S160 is a process of executing at least one of the following: an action of the gas control unit 57 increasing the fuel gas supply amount by driving at least one of the variable pressure regulating valve 42 and the hydrogen pump 44; an action of the gas control unit 57 increasing the stoichiometric ratio of the fuel gas by driving at least one of the variable pressure regulating valve 42 and the hydrogen pump 44; an action of the gas control unit 57 increasing the oxidation gas supply amount by driving the air compressor 31; an action of the gas control unit 57 increasing the stoichiometric ratio of the oxidation gas by driving the air compressor 31; and an action of the output control unit 58 decreasing the output current of the fuel cell 15.

Increasing the supply amount of the fuel gas or the oxidation gas results in an increased amount of moisture being carried away by that reactant gas, which can restrict wetting of the fuel cell 15. Increasing the stoichiometric ratio of the fuel gas or the oxidation gas results in an increased amount of moisture being carried away by that reactant gas relative to the amount of water generated by electricity generation, which can restrict wetting of the fuel cell 15. Decreasing the output current results in a decreased amount of water being generated, which can restrict wetting of the fuel cell 15.

Thus, wetting is restricted as at least one of the amount of moisture carried away by the reactant gas increases and the amount of water generated decreases. As a result, the fuel cell 15 can be restored from the excessively wet state to an appropriate wet state. In the case of decreasing the output current, a lack of electricity to meet the load demand can be made up for, for example, with electricity supplied from a battery (not shown) installed in the fuel cell system 110.

The wetting process executed in step S170 is a process of executing at least one of the following: an action of the gas control unit 57 decreasing the fuel gas supply amount by driving at least one of the variable pressure regulating valve 42 and the hydrogen pump 44; an action of the gas control unit 57 decreasing the stoichiometric ratio of the fuel gas by driving at least one of the variable pressure regulating valve 42 and the hydrogen pump 44; an action of the gas control unit 57 decreasing the oxidation gas supply amount by driving the air compressor 31; an action of the gas control unit 57 decreasing the stoichiometric ratio of the oxidation gas by driving the air compressor 31; and an action of the output control unit 58 increasing the output current of the fuel cell 15.

Decreasing the supply amount of the fuel gas or the oxidation gas results in a decreased amount of moisture being carried away by that reactant gas, which allows the fuel cell 15 to wet. Decreasing the stoichiometric ratio of the fuel gas or the oxidation gas results in a decreased amount of moisture being carried away by that reactant gas relative to the amount of water generated by electricity generation, which allows the fuel cell 15 to wet. Increasing the output current results in an increased amount of water being generated, which allows the fuel cell 15 to wet.

Thus, wetting is promoted as at least either the amount of moisture carried away by the reactant gas decreases or the amount of water generated increases. As a result, the fuel cell 15 can be restored from the excessively dry state to an appropriate wet state. In the case of increasing the output current, a portion of electricity exceeding the load demand can be charged, for example, to the battery (not shown) installed in the fuel cell system 110.

The fuel cell system 110 having the above configuration can not only achieve the same effects as the first and second embodiments, but also achieve an effect of eliminating an excessively wet state or an excessively dry state to thereby restore the fuel cell 15 to an appropriate wet state. Once restored to an appropriate wet state, the fuel cell 15 is back in a state where the correlation exists between the value of the phase difference $\theta$ and the wet state.

Which of the above-described actions to perform as the drying process executed in step S160 and the wetting process executed in step S170 may be set in advance. Alternatively, the action to be adopted may be appropriately selected according to the operation state of the fuel cell system 110 when the fuel cell 15 is determined to be in an excessively wet state or an excessively dry state.

Processes different from those described above can also be performed as the drying process in step S160 and the wetting process in step S170 in the inappropriate wetness inferring process of FIG. 10. For example, as the drying process, the gas control unit 57 of the controller 50 may decrease the back pressure of the oxidation gas by increasing the degree of opening of the back pressure valve 39 provided on the oxidation gas discharge pipe 33. This results in an increased amount of moisture being carried away by the oxidation gas, which can restrict wetting of the fuel cell 15. As the wetting process, the gas control unit 57 may raise the back pressure of the oxidation gas by decreasing the degree of opening of the back pressure valve 39. This results in a decreased amount of moisture being carried away by the oxidation gas, which allows the fuel cell 15 to wet. A back pressure valve may be provided on the fuel gas discharge pipe through which the anode off-gas is discharged from the fuel cell 15, and this back pressure valve may be configured such that the degree of opening thereof can be controlled by the gas control unit 57. In this case, control similar to the control described in connection with the back pressure valve 39 can be performed as the drying process and the wetting process.

A humidifier may be provided on the oxidation gas supply pipe 32, and the oxidation gas may be humidified before being supplied to the fuel cell 15. Alternatively, a humidifier may be provided on the fuel gas supply pipe 22 or the fuel gas return pipe 24, downstream of the gas-liquid separator 45, and the fuel gas may be humidified before being supplied to the fuel cell 15. In this case, control of decreasing the amount of humidification of at least one of the oxidation gas and the fuel gas can be performed as the drying process in step S160. Control of increasing the amount of humidification of at least one of the oxidation gas and the fuel gas can be performed as the wetting process in step S170.

In the third embodiment, when it is inferred that the fuel cell 15 is in an inappropriate wet state in step S120 in the process similar to the inappropriate wetness inferring process of the first embodiment shown in FIG. 7, an excessively wet state and an excessively dry state are further distinguished based on whether the value of the phase difference change amount $\Delta\theta$ is positive or negative. However, this configuration may be different. For example, in the inappropriate wetness inferring process of the second embodiment shown in FIG. 8, the drying process may be executed when the fuel cell 15 is determined to be in an excessively wet state in step S132, and the wetting process may be executed when the fuel cell 15 is determined to be in an excessively dry state in step S134.

D. Other Embodiments (D1) In the above embodiments, the phase difference change amount $\Delta\theta$ is derived when the operation condition is determined to have changed in step S100, but this configuration may be different. For example, the phase difference change amount $\Delta\theta$ may be always repeatedly derived, also in cases other than when the operation condition is determined to have changed.

(D2) In the fuel cell systems of the above embodiments, the controller 50 may further include an inference unit that infers the wet state of the fuel cell 15 based on the value of the phase difference θ. One example of this configuration will be described below.

Figure 11:
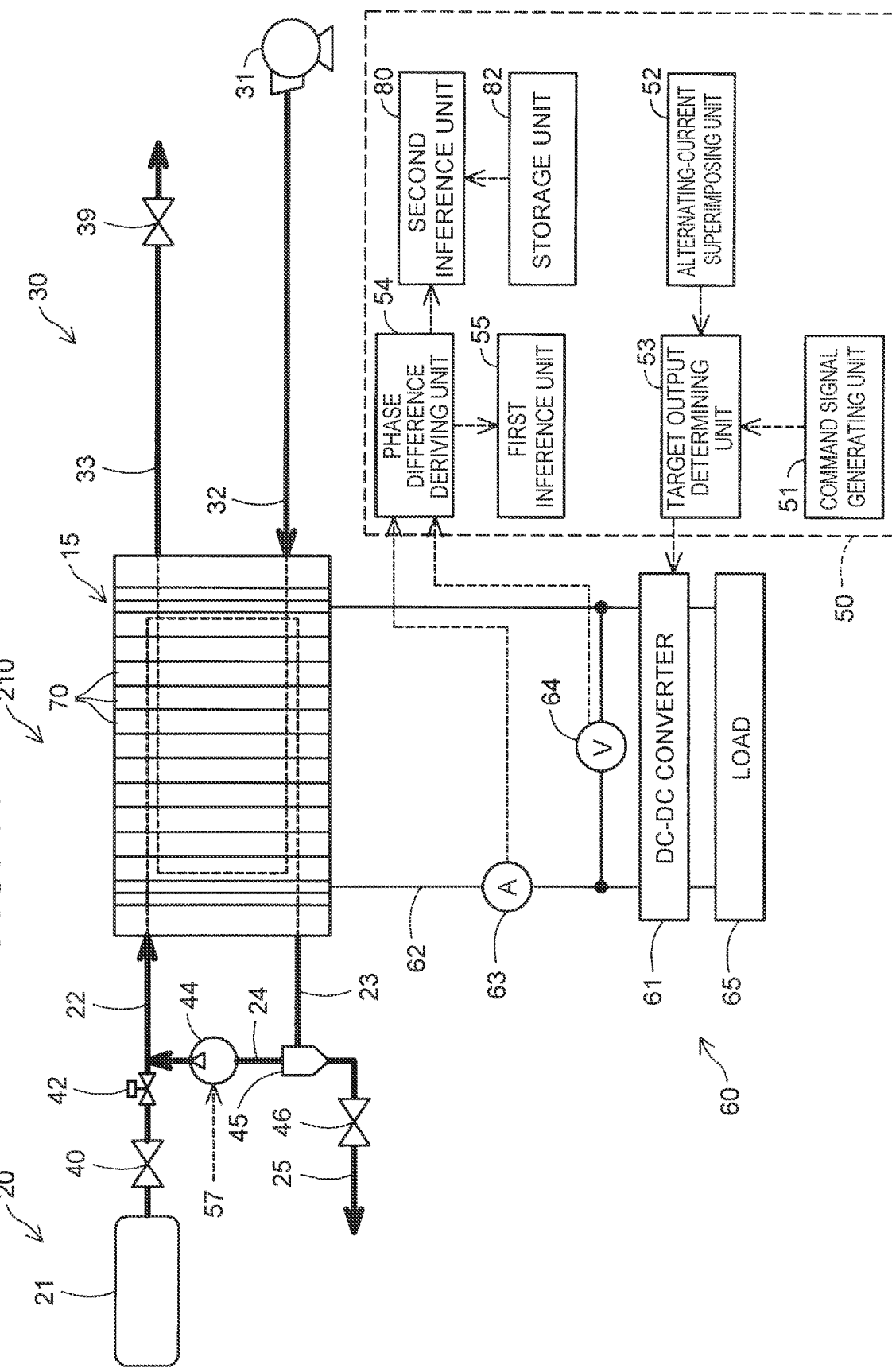
FIG. 11 is a diagram showing a schematic configuration of another fuel cell system.

FIG. 11 is a diagram showing a schematic configuration of a fuel cell system 210 as another embodiment. The fuel cell system 210 has a configuration similar to that of the fuel cell system 10 in the first embodiment, and the controller 50 additionally includes a second inference unit 80 and a storage unit 82 as functional blocks. Those parts that this embodiment has in common with the first embodiment will be denoted by the same reference signs and a detailed description thereof will be omitted. The configuration including the second inference unit 80 and the storage unit 82 may be applied to the fuel cell system 110 of FIG. 9.

The storage unit 82 is a memory that stores a relation between the value of the phase difference θ and the moisture content inside the fuel cell 15 when the fuel cell 15 is in an appropriate wet state. For example, the relation between the value of the phase difference θ and the moisture content inside the fuel cell 15 when the fuel cell 15 is in an appropriate wet state can have the form of a map, like the one shown in FIG. 3, that shows a result of an experimental study on the relation between the value of the phase difference θ and the moisture content inside the fuel cell 15. The controller 50 of the fuel cell system 210 executes an inappropriate wetness inferring process that is the same as in one of the above-described embodiments. In this case, the phase difference deriving unit 54 repeatedly derives the phase difference θ also in cases other than when the operation condition is determined to have changed in step S100. When it is inferred that the fuel cell 15 is in an appropriate wet state, the second inference unit 80 repeatedly executes an action of inferring the wet state of the fuel cell 15 with reference to the map stored in the storage unit 82 by using the value of the phase difference θ derived by the phase difference deriving unit 54. The fuel cell system 210 having this configuration can learn the wet state of the fuel cell 15 by means of the value of the phase difference θ, as long as the fuel cell 15 is in an appropriate wet state. The form of the above-described relation stored in the storage unit 82 is not limited to the map described above, but may instead be, for example, a function showing, as an approximate formula, the relation between the value of the phase difference θ and the moisture content inside the fuel cell 15 when the fuel cell 15 is in an appropriate wet state.

The present disclosure is not limited to the above-described embodiments but can be realized in various configurations within the scope of the gist of the disclosure. For example, to partially or entirely solve the above-described problem or to achieve some or all of the above-described effects, the technical features of the embodiments corresponding to the technical features of the forms of implementation described in SUMMARY can be substituted or combined as appropriate. Unless described as being essential in the present specification, technical features can be omitted as appropriate.

What is claimed is:

1. A fuel cell system comprising:
   a fuel cell;
   a reactant gas supply section configured to supply the fuel cell with a fuel gas and an oxidation gas that are reactant gases;
   a converter configured to take out a current and a voltage from the fuel cell toward a load and control the current and the voltage;
   an alternating-current superimposing unit configured to superimpose an alternating-current signal on one of the current and the voltage taken out from the fuel cell by the converter, wherein the ac signal is a single signal frequency between 20 Hz and 100 Hz;
   a phase difference deriving unit configured to extract an alternating-current component from an output of the fuel cell and derive a phase difference that is a phase lag of an alternating-current voltage relative to an alternating current in the alternating-current component; and
   a first inference unit configured to infer that a wet state of the fuel cell is an inappropriate wet state corresponding to an excessively wet state or an excessively dry state, when, immediately after a magnitude of a change in a value of at least one of parameters that are a flow rate of the reactant gas supplied to the fuel cell, a stoichiometric ratio of the reactant gas, and an output current of the fuel cell, during a predetermined first measurement period is determined to have exceeded a predetermined criterion, an absolute value of an amount of change in the phase difference during a predetermined second measurement period has become equal to or larger than a predetermined criterion value for the phase difference.

2. The fuel cell system according to claim 1, wherein the first inference unit determines that the magnitude of the change in the value of the parameter has exceeded the predetermined criterion, when an amount of change in the value of the parameter during the first measurement period has exceeded a predetermined criterion value for the parameter.

3. The fuel cell system according to claim 1, wherein the first inference unit determines that the magnitude of the change in the value of the parameter has exceeded the predetermined criterion, when a ratio of an amount of change in the value of the parameter during the first measurement period to a value of the parameter at start of the first measurement period has exceeded a predetermined criterion value for the parameter.

4. The fuel cell system according to claim 1, wherein, when the first inference unit infers that the wet state is the inappropriate wet state, the first inference unit infers that the wet state is the excessively wet state when the amount of change in the phase difference has a negative value, and infers that the wet state is the excessively dry state when the amount of change in the phase difference has a positive value.

5. The fuel cell system according to claim 4, further comprising a gas control unit configured to control the reactant gas supply section, wherein the gas control unit causes the reactant gas supply section to:
   increase an amount of at least one of the fuel gas and the oxidation gas supplied to the fuel cell, when the first inference unit has inferred that the wet state is the excessively wet state; and
   decrease an amount of at least one of the fuel gas and the oxidation gas supplied to the fuel cell, when the first inference unit has inferred that the wet state is the excessively dry state.

6. The fuel cell system according to claim 4, further comprising a gas control unit configured to control the reactant gas supply section, wherein the gas control unit causes the reactant gas supply section to:
   increase the stoichiometric ratio of the reactant gas supplied to the fuel cell, when the first inference unit has inferred that the wet state is the excessively wet state; and decrease the stoichiometric ratio of the reactant gas supplied to the fuel cell, when the first inference unit has inferred that the wet state is the excessively dry state.

7. The fuel cell system according to claim 4, further comprising an output control unit configured to control the output current of the fuel cell, wherein:
the output control unit decreases the output current when the first inference unit has inferred that the wet state is the excessively wet state; and
the output control unit increases the output current when the first inference unit has inferred that the wet state is the excessively dry state.

8. The fuel cell system according to claim 4, further comprising:
a storage unit configured to store a relation between an amount of moisture inside the fuel cell and the phase difference; and
a second inference unit configured to infer the amount of moisture inside the fuel cell with reference to the relation stored in the storage unit by using the phase difference derived by the phase difference deriving unit.

* * * * *